(12) United States Patent
Yosui et al.

(10) Patent No.: US 11,202,371 B2
(45) Date of Patent: Dec. 14, 2021

(54) MULTILAYER SUBSTRATE

(71) Applicant: Murata Manufacturing Co., Ltd., Nagaokakyo (JP)

(72) Inventors: Kuniaki Yosui, Nagaokakyo (JP); Shingo Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 160 days.

(21) Appl. No.: 16/536,347

(22) Filed: Aug. 9, 2019

(65) Prior Publication Data

US 2019/0364663 A1 Nov. 28, 2019

Related U.S. Application Data

(63) Continuation of application No. PCT/JP2018/007494, filed on Feb. 28, 2018.

(30) Foreign Application Priority Data

Mar. 22, 2017 (JP) .............................. JP2017-055705

(51) Int. Cl.
| | |
|---|---|
| *H05K 7/00* | (2006.01) |
| *H05K 1/18* | (2006.01) |
| *H05K 1/16* | (2006.01) |
| *H05K 1/11* | (2006.01) |

(52) U.S. Cl.
CPC ............ *H05K 1/181* (2013.01); *H05K 1/115* (2013.01); *H05K 1/165* (2013.01); *H05K 2201/0141* (2013.01); *H05K 2201/10151* (2013.01)

(58) Field of Classification Search
CPC ........ H05K 1/181; H05K 1/165; H05K 1/115; H05K 2201/0141; H05K 2201/10151
See application file for complete search history.

(56) References Cited

U.S. PATENT DOCUMENTS

| | | | |
|---|---|---|---|
| 2002/0044251 A1* | 4/2002 | Togashi | G02F 1/13452 349/149 |
| 2006/0220491 A1* | 10/2006 | Takeuchi | H02K 3/26 310/266 |
| 2009/0068426 A1* | 3/2009 | Nishizawa | H05K 3/4629 428/209 |

(Continued)

FOREIGN PATENT DOCUMENTS

| | | |
|---|---|---|
| JP | 55-117462 A | 9/1980 |
| JP | 03-243148 A | 10/1991 |

(Continued)

OTHER PUBLICATIONS

Official Communication issued in International Patent Application No. PCT/JP2018/007494 dated May 29, 2018.

*Primary Examiner* — Yuriy Semenenko
(74) *Attorney, Agent, or Firm* — Keating & Bennett, LLP

(57) ABSTRACT

A multilayer substrate includes a stacked body obtained by stacking a plurality of insulating base material layers, a driver IC including a plurality of mounting electrodes, coils, and magnetic sensors. The driver IC and the magnetic sensors are mounted to the stacked body. The coils include a first end and a second end that are electrically connected to the driver IC through a conductive bonding material. The first end and a mounting electrode are connected at one position through the conductive bonding material.

20 Claims, 20 Drawing Sheets

(56) References Cited

U.S. PATENT DOCUMENTS

| | | | | |
|---|---|---|---|---|
| 2009/0266900 A1* | 10/2009 | Ikemoto | ................... | H01Q 9/28 |
| | | | | 235/492 |
| 2010/0103058 A1* | 4/2010 | Kato | ................ | G06K 19/07786 |
| | | | | 343/702 |
| 2015/0340151 A1* | 11/2015 | Yosui | ................... | H05K 1/0281 |
| | | | | 336/200 |
| 2016/0029489 A1* | 1/2016 | Wakabayashi | ....... | H05K 3/4697 |
| | | | | 174/260 |
| 2017/0034911 A1* | 2/2017 | Otsubo | ................ | H01L 23/145 |
| 2018/0017634 A1* | 1/2018 | Ueda | ................... | G01R 33/0094 |
| 2018/0173080 A1* | 6/2018 | Enta | ......................... | G03B 5/00 |

FOREIGN PATENT DOCUMENTS

| | | |
|---|---|---|
| JP | 2006-288166 A | 10/2006 |
| JP | WO2015170539 * | 11/2015 |
| JP | 2016-224262 A | 12/2016 |
| JP | WO2016194345 * | 12/2016 |
| WO | 2004/047252 A1 | 6/2004 |
| WO | 2010/103695 A1 | 9/2010 |
| WO | 2015/170539 A1 | 11/2015 |

\* cited by examiner

FIG.5
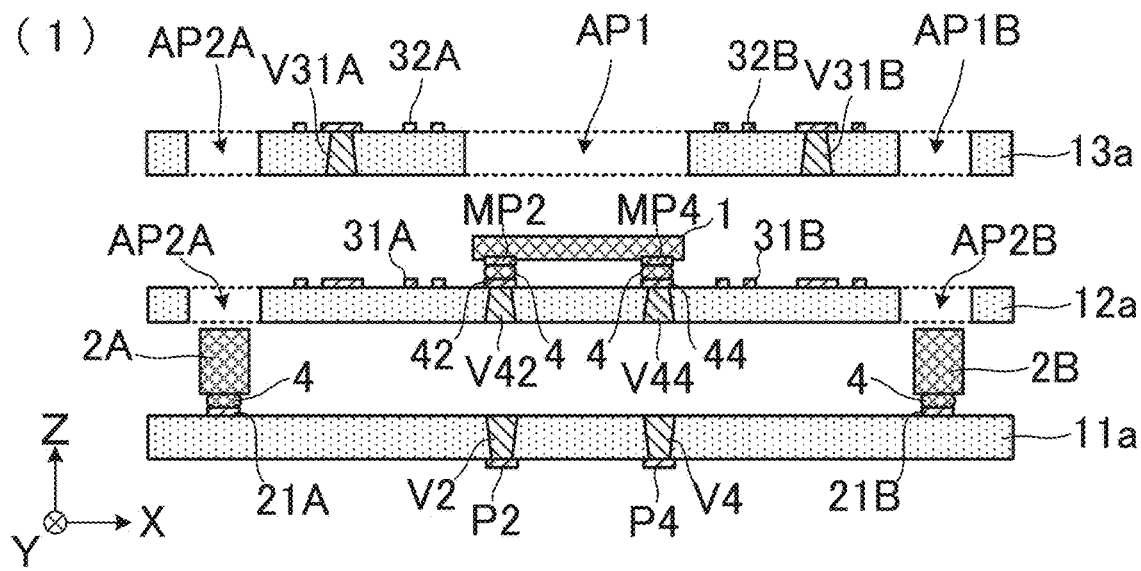
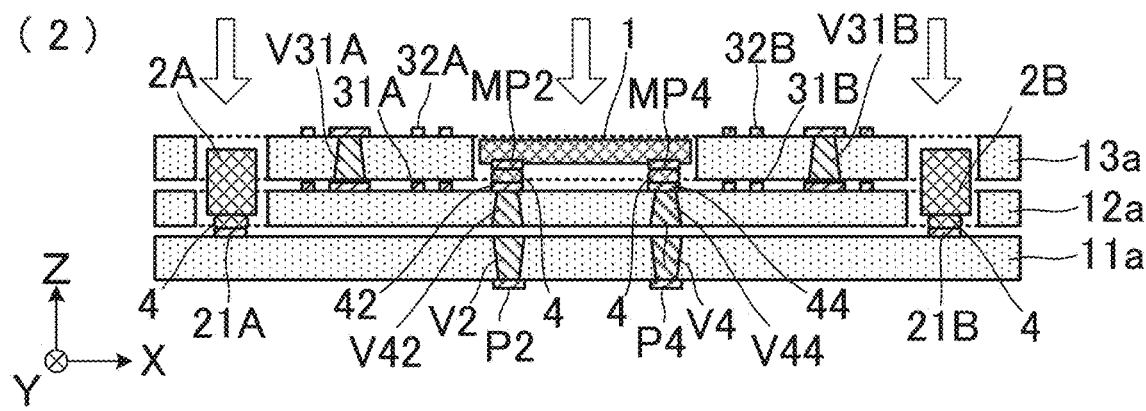
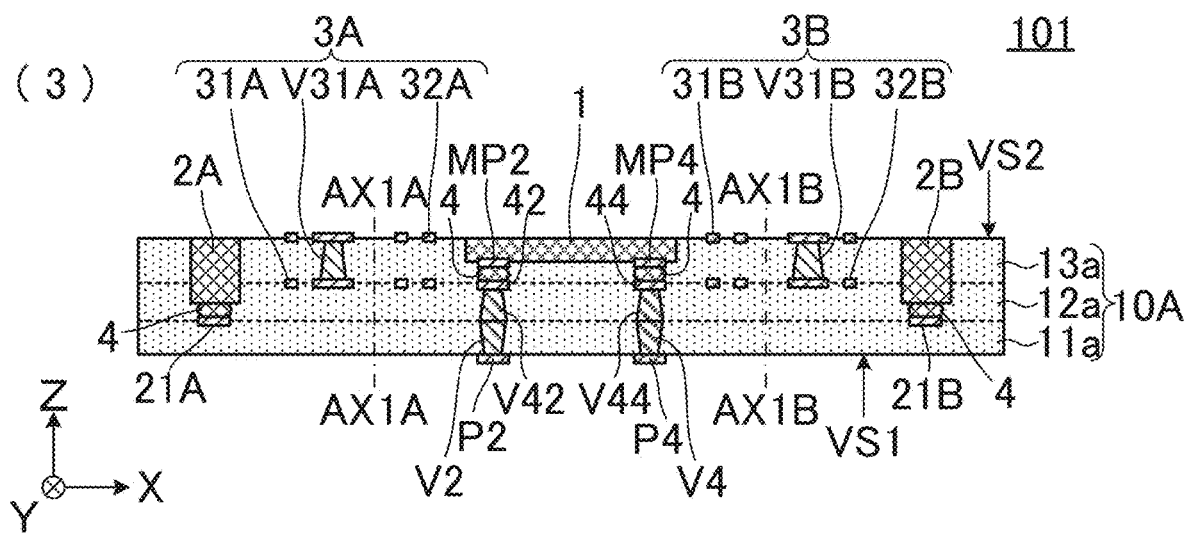

FIG.9
(1)
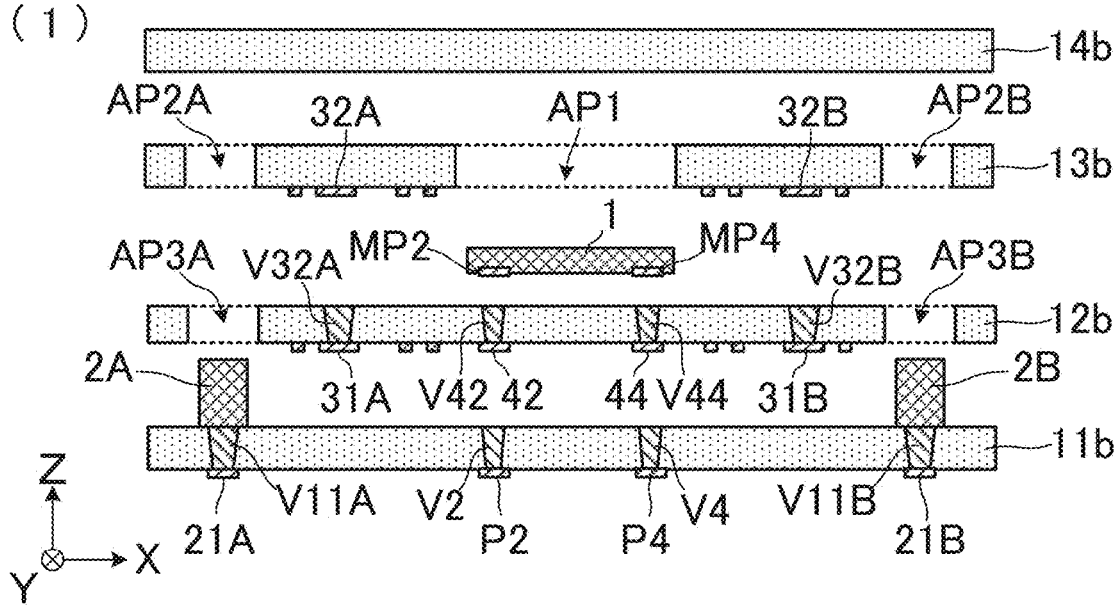
(2)
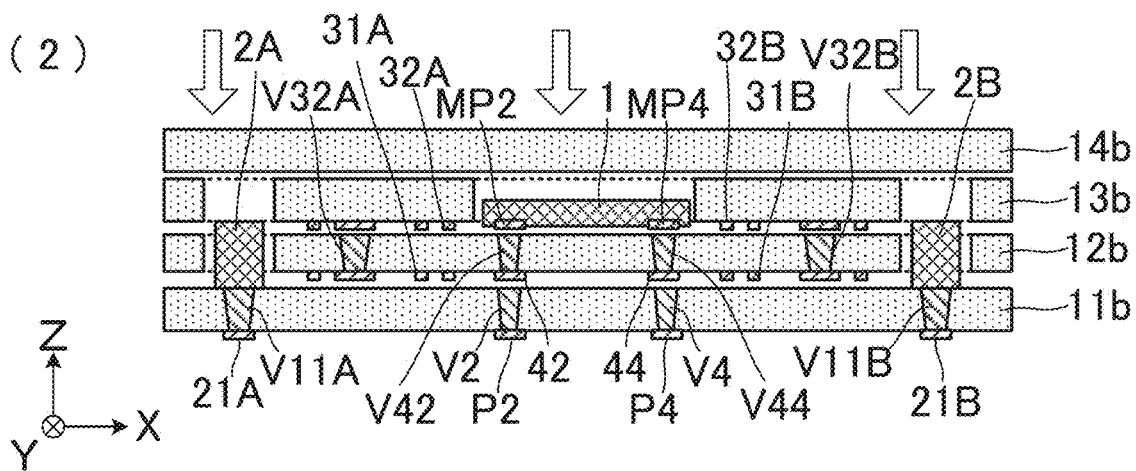
(3)
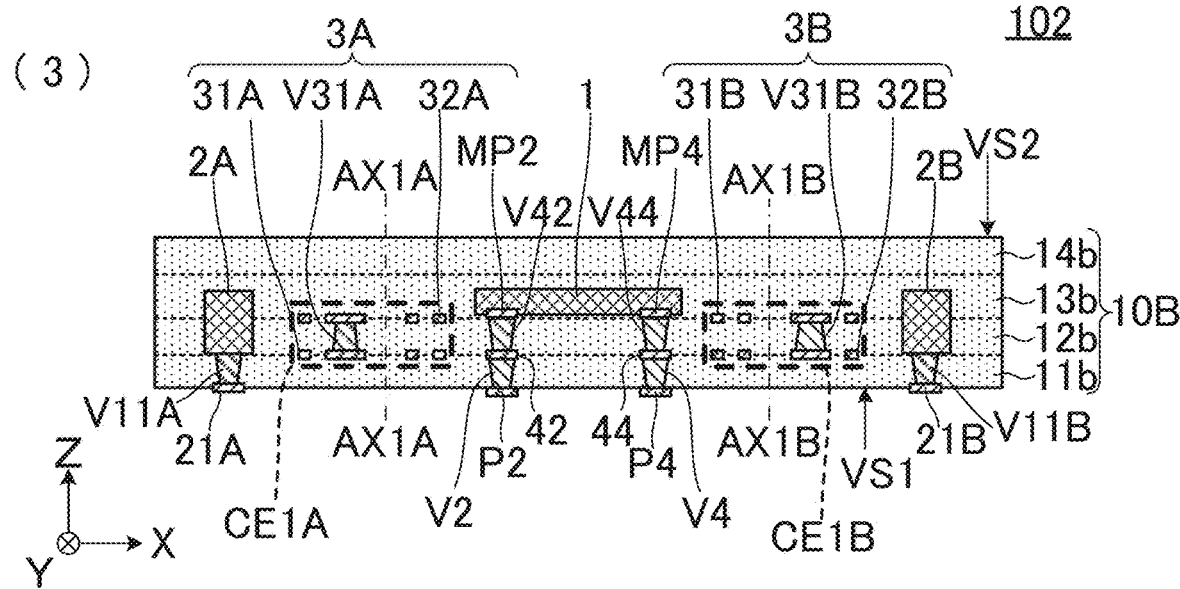

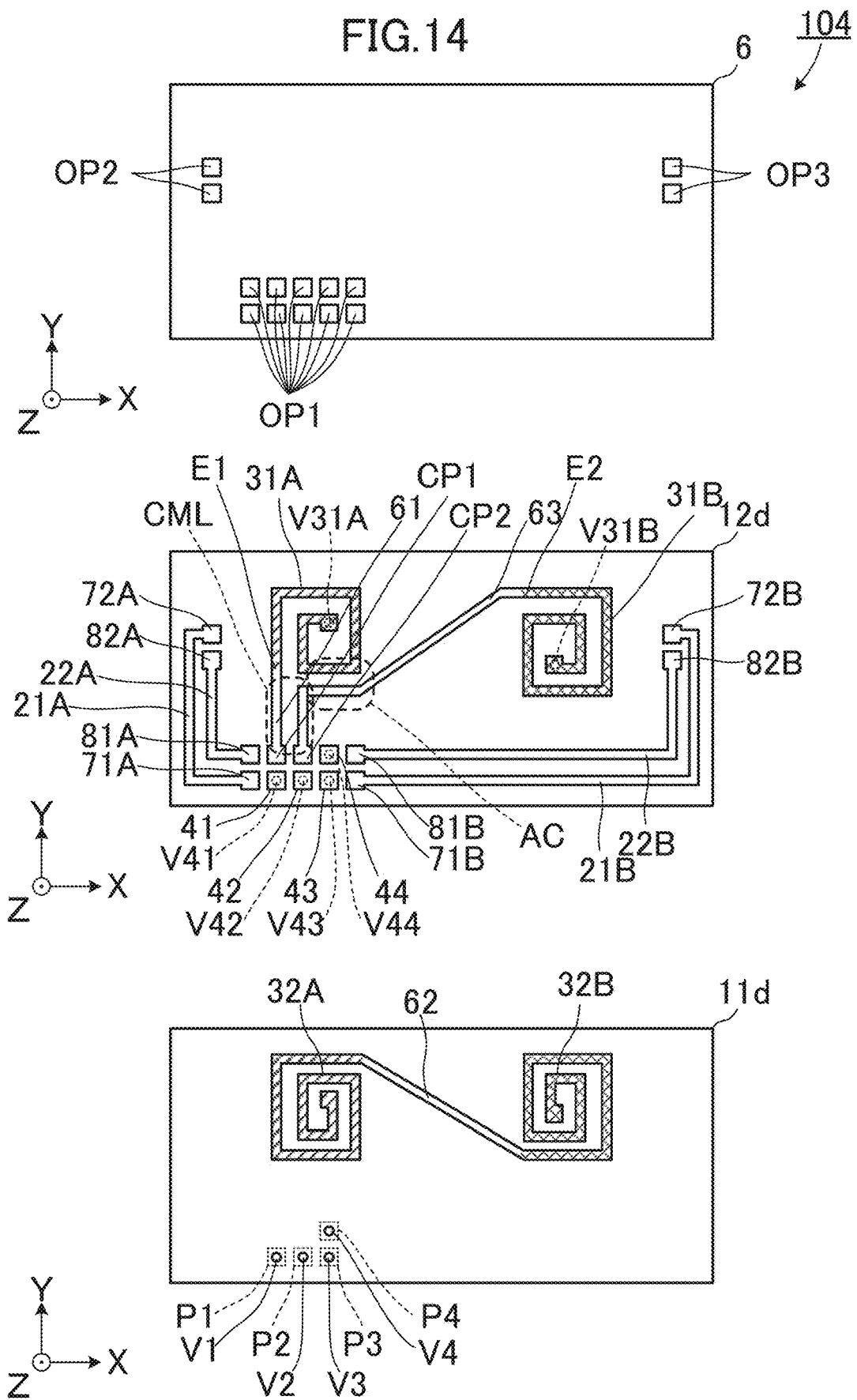

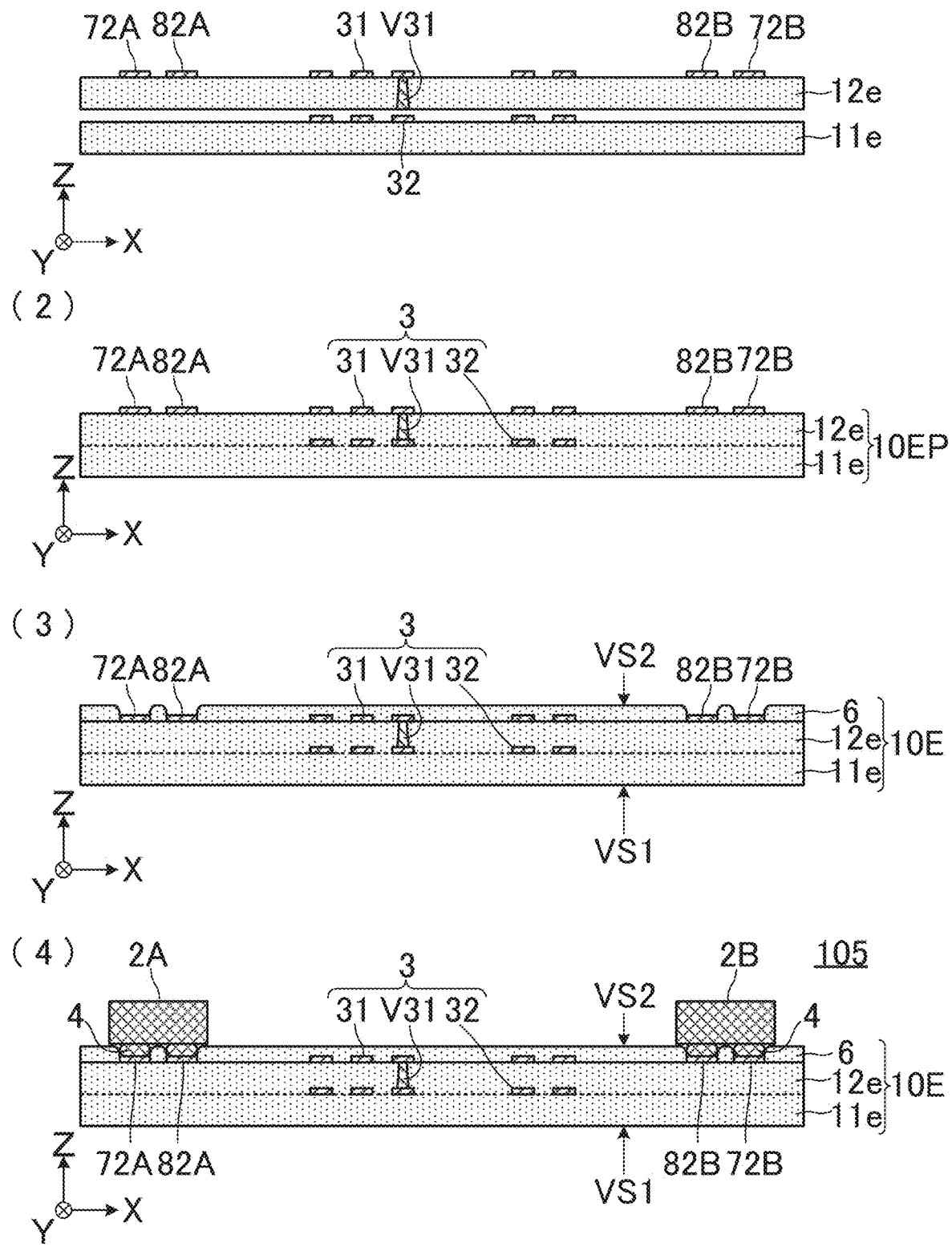

MULTILAYER SUBSTRATE

CROSS REFERENCE TO RELATED APPLICATIONS

This application claims the benefit of priority to Japanese Patent Application No. 2017-055705 filed on Mar. 22, 2017 and is a Continuation Application of PCT Application No. PCT/JP2018/007494 filed on Feb. 28, 2018. The entire contents of each application are hereby incorporated herein by reference.

BACKGROUND OF THE INVENTION

1. Field of the Invention

The present invention relates to a multilayer substrate, and in particular, to a multilayer substrate including an IC and a coil provided in a stacked body.

2. Description of the Related Art

Conventionally, various types of actuators that include a coil, a driver IC, and a magnetic sensor and are driven by electromagnetic power have been known. For example, Japanese Unexamined Patent Application Publication No. 2016-224262 discloses an actuator including a coil, a driver IC, and a magnetic sensor that are mounted to a substrate. The actuator is able to move a movable body including a magnet by a magnetic field generated from the coil.

However, in the actuator disclosed in Japanese Unexamined Patent Application Publication No. 2016-224262, the following problems may cause variations in the characteristics of the actuator.

(a) The actuator has a configuration in which the coil and the driver IC are separately mounted to the substrate, so that the mounting position of the driver IC with respect to the coil is easily shifted during mounting. The current flowing into wiring between the driver IC and the coil is especially large in the actuator, and a comparatively large magnetic field is also generated from the wiring. Therefore, when the mounting position of the driver IC shifts and the route of the wiring changes, the magnetic field generated from the coil may change due to the magnetic field from the wiring.

(b) In addition, the driver IC is connected to the magnetic sensor and controls the current flowing into the coil based on information (a signal from the magnetic sensor) obtained from the magnetic sensor. The current flowing into the wiring that connects the driver IC and the magnetic sensors is much smaller than the current flowing into the wiring that connects the coil and the driver IC, and is susceptible to noise. Therefore, under the effects of the magnetic field generated from the driver IC and the magnetic field generated from the wiring that connects the driver IC and the coil, the driver IC may falsely recognize a signal from the magnetic sensor.

(c) Further, when the mounting position of the driver IC with respect to the coil shifts, the action on a magnet may change from a specified state due to the magnetic field from the driver IC of which the mounting position has shifted.

SUMMARY OF THE INVENTION

Preferred embodiments of the present invention provide multilayer substrates each including a coil and a driver IC, the multilayer substrates being capable of reducing variations for each generated magnetic field by reducing the shift of the position of the driver IC with respect to the coil.

A multilayer substrate according to a preferred embodiment of the present invention includes a stacked body including a plurality of insulating base material layers that are stacked, a driver IC mounted to the stacked body and including a plurality of mounting electrodes, a coil provided in the stacked body and including a first end and a second end each of which is electrically connected to one of the plurality of mounting electrodes through a conductive bonding material, and a magnetic sensor mounted to the stacked body and connected to the driver IC, and the first end and the mounting electrode are connected at one position through the conductive bonding material.

With this configuration, compared with a case in which the first end of the coil and the mounting electrode are connected at two or more positions through the conductive bonding material, the positional relationship between the driver IC and the coil is difficult to shift. Therefore, the variations of generated magnetic fields due to the shift of the positional relationship between the driver IC and the coil are able to be reduced.

The conductive bonding material may be provided in a hole that penetrates through any one of the plurality of insulating base material layers.

The second end and the mounting electrode may preferably be connected at one position through the conductive bonding material. With this configuration, the number of the positions at which the first end of the coil and the mounting electrode are connected through the conductive bonding material and the number of the positions at which the second end of the coil and the mounting electrode are connected through the conductive bonding material are all one. Therefore, the shift of the positional relationship between the driver IC and the coil is further reduced.

The magnetic sensor may preferably include a first magnetic sensor and a second magnetic sensor, and the first magnetic sensor and the second magnetic sensor may preferably be disposed at positions that are symmetric or substantially symmetric with respect to a center of the driver IC. With this configuration, even when noise is superimposed on the magnetic field mainly generated from the driver IC, the effects of the magnetic field mainly generated from the driver IC on the first magnetic sensor and the second magnetic sensor are able to be equal or substantially equal (equivalent). Therefore, the addition of signals from the first magnetic sensor and the second magnetic sensor cancels a noise component, and is able to improve the accuracy of detecting a position of the magnet by the magnetic sensor.

Wiring between the driver IC and the first magnetic sensor and wiring between the driver IC and the second magnetic sensor may preferably be symmetric or substantially symmetric with respect to the center of the driver IC. With this configuration, even when noise is superimposed on the magnetic field mainly generated from the driver IC, the effects of the magnetic field mainly generated from the driver IC on the wiring between the driver IC and the magnetic sensor (the first magnetic sensor and the second magnetic sensor) are able to be equal or substantially equal (equivalent). Therefore, the addition of signals from the first magnetic sensor and the second magnetic sensor cancels a noise component, and, as a result, is able to improve the accuracy of detecting a position of the magnet by the magnetic sensor.

The coil may preferably be a single coil, and the first magnetic sensor and the second magnetic sensor may preferably be disposed at positions symmetric or substantially symmetric with respect to a winding axis of the coil. With this configuration, even when noise is superimposed on the magnetic field emitted from the coil, the effects of the magnetic field generated from the coil on the first magnetic sensor and the second magnetic sensor are able to be equal or substantially equal (equivalent). Therefore, the addition of signals from the first magnetic sensor and the second magnetic sensor cancels a noise component, and is able to improve the accuracy of detecting a position of the magnet by the magnetic sensor.

The multilayer substrate may preferably further include a first connection electrode provided on the insulating base material layer and connected to the plurality of mounting electrodes through the conductive bonding material, a second connection electrode provided on the insulating base material layer and connected to the plurality of mounting electrodes through the conductive bonding material, a first connection conductor provided on the insulating base material layer and connecting the first end of the coil and the first connection electrode, and a second connection conductor provided on the insulating base material layer and connecting the second end of the coil and the second connection electrode, and the insulating base material layer may preferably include a parallel portion, and the first connection conductor and the second connection conductor may preferably be parallel or substantially parallel to each other in the parallel portion so that directions of currents are opposite to each other. With this configuration, in the parallel portion, magnetic fluxes generated from the first connection conductor and the second connection conductor, the magnetic fluxes not having substantially contributed to formation of the magnetic field of the coil that interacts with a magnet, are counteracted. Accordingly, with this configuration, unnecessary radiation from portions (the first connection conductor and the second connection conductor) other than the coil is able to be reduced.

According to preferred embodiments of the present invention, multilayer substrates each including a coil and a driver IC, the multilayer substrates being capable of reducing variations in characteristics by reducing the shift of the position of the driver IC with respect to the coil, are obtained.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is a cross-sectional view sequentially showing a process of manufacturing the multilayer substrate 101.

FIG. 9 is a cross-sectional view sequentially showing a process of manufacturing the multilayer substrate 102.

FIG. 14 is a plan view of each of a protective layer 6 and base material layers 11d and 12d of the multilayer substrate 104.

FIG. 20 is a cross-sectional view sequentially showing a process of manufacturing the multilayer substrate 105.

DETAILED DESCRIPTION OF THE PREFERRED EMBODIMENTS

Figure 1:
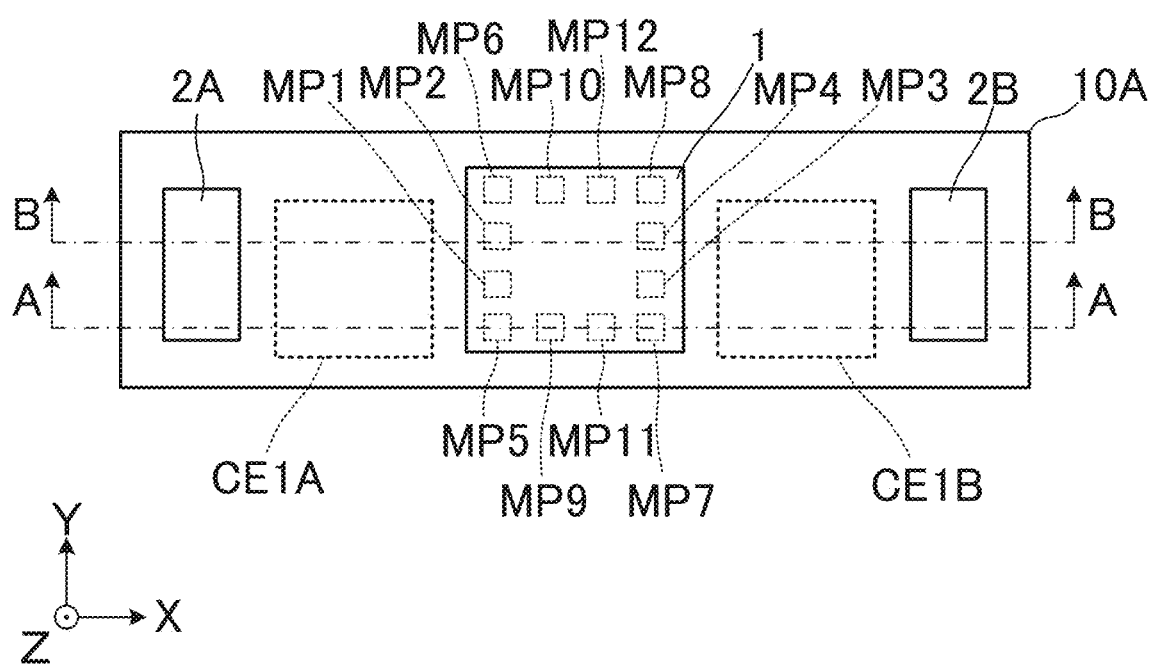
FIG. 1 is a plan view of a multilayer substrate 101 according to a first preferred embodiment of the present invention.

Hereinafter, preferred embodiments of the present invention will be described with reference to the attached drawings and several specific examples. In the drawings, components and elements assigned with the same reference numerals or symbols will represent identical or substantially identical components and elements. While preferred embodiments of the present invention are divided and described for the sake of convenience in consideration of ease of description or understanding of main points, elements described in different preferred embodiments are able to be partially replaced and combined with each other. In second and subsequent preferred embodiments, a description of matters common to the first preferred embodiment will be omitted and only different points will be described. In particular, the same advantageous functions and effects by the same configurations will not be described one by one for each preferred embodiment.

First Preferred Embodiment

Figure 2A:
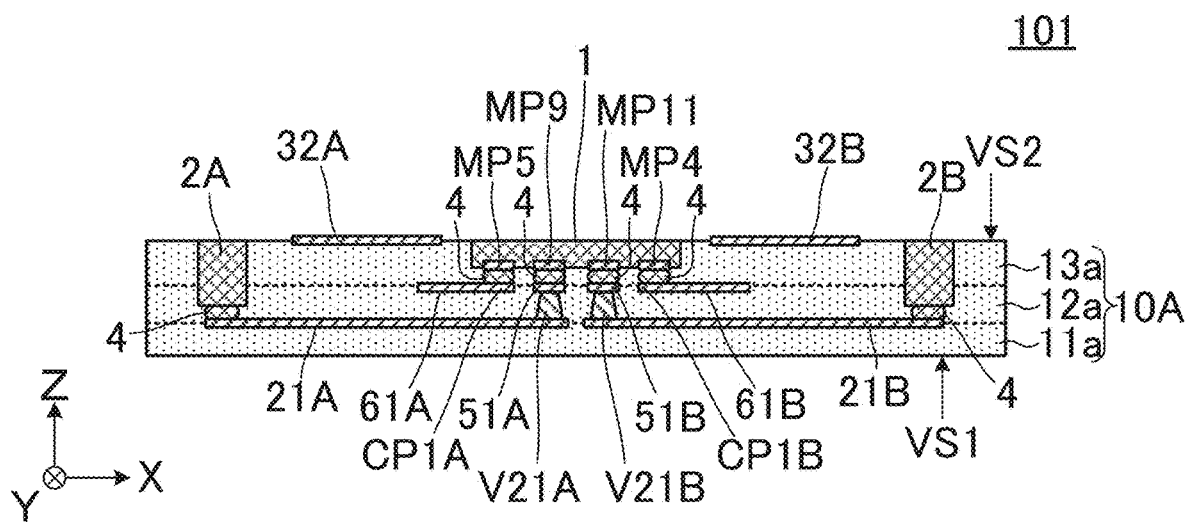
FIG. 2A is an A-A cross-sectional view in FIG. 1.
Figure 2B:
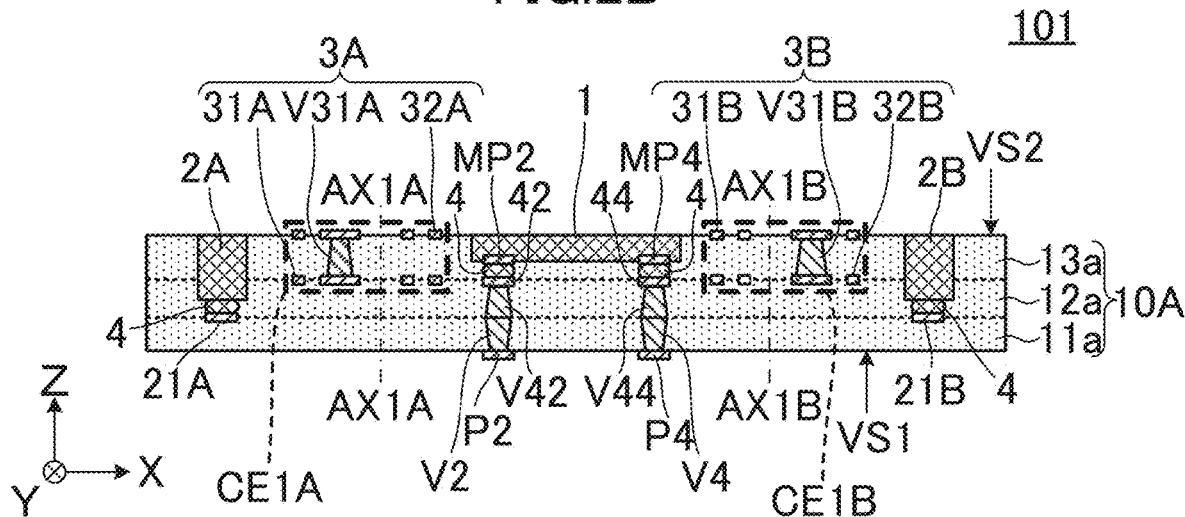
FIG. 2B is a B-B cross-sectional view in FIG. 1.
Figure 3:
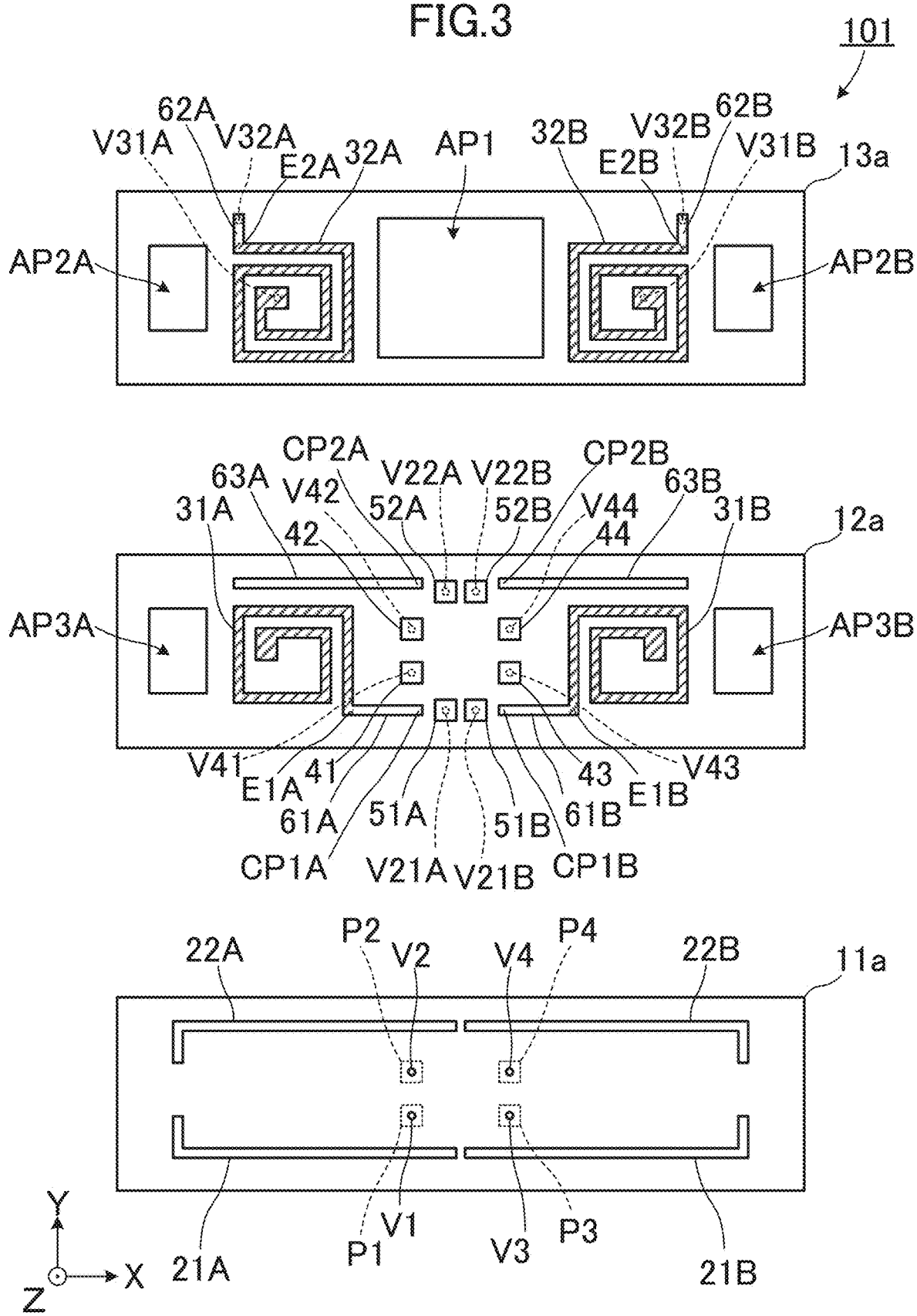
FIG. 3 is a plan view of each of base material layers 11a, 12a, and 13a of the multilayer substrate 101.

FIG. 1 is a plan view of a multilayer substrate 101 according to a first preferred embodiment of the present invention. FIG. 2A is an A-A cross-sectional view in FIG. 1, and FIG. 2B is a B-B cross-sectional view in FIG. 1. FIG. 3 is aplan view of each of base material layers 11a, 12a, and 13a of the multilayer substrate 101. In FIGS. 2A and 2B, the thickness of each portion is indicated in an exaggerated manner. The same may be applied to a cross-sectional view in each of the following preferred embodiments. In addition, in FIG. 3, in order to make the structure more understandable, coil conductors 31A, 31B, 32A, and 32B are indicated by hatching.

The multilayer substrate 101 includes a stacked body 10A, a driver IC 1, magnetic sensors 2A and 2B, and coils 3A and 3B (to be described in detail later) provided in the stacked body 10A. The driver IC 1 and the magnetic sensors 2A and 2B are mounted to the stacked body 10A.

The driver IC 1 moves a magnet (to be described in detail later) attached to a movable body by controlling a power supply of the coils. The driver IC 1, as shown in FIG. 1, includes a plurality of mounting electrode MP1, MP2, MP3, MP4, MP5, MP6, MP7, MP8, MP9, MP10, MP11, and MP12. The plurality of mounting electrodes MP1 to MP12 are preferably, for example, rectangular or substantially rectangular electrodes provided on a mounting surface (a lower surface of the driver IC 1 in FIGS. 2A and 2B) of the driver IC 1.

The magnetic sensors 2A and 2B are elements that mainly sense a magnetic field from the outside, and detect an amount of movement of the magnet (to be described in detail later) attached to the movable body. The magnetic sensors 2A and 2B are preferably Hall elements using the Hall effect, for example.

The stacked body 10A preferably has, for example, a cuboid shape including a longitudinal direction that coincides with the X-axis direction and includes a first principal surface VS1 and a second principal surface VS2 that face each other. Four external electrodes P1, P2, P3, and P4 are provided on the first principal surface VS1 of the stacked body 10A. In the multilayer substrate 101, this first principal surface VS1 is a mounting surface.

The stacked body 10A is obtained by sequentially stacking a plurality of insulating base material layers 11a, 12a, and 13a that are preferably made of a resin material (a thermoplastic resin), for example. Each of the plurality of insulating base material layers 11a, 12a, and 13a is preferably, for example, a rectangular or substantially rectangular flat plate including a longitudinal direction that coincides with the X axis. The plurality of insulating base material layers 11a, 12a, and 13a are sheets that are preferably made of, for example, a liquid crystal polymer as a principal material.

Conductors 21A, 21B, 22A, and 22B are provided on a surface of the insulating base material layer 11a. The conductor 21A is preferably, for example, an L-shaped conductor disposed near a first corner (a lower left corner of the insulating base material layer 11a in FIG. 3) of the insulating base material layer 11a. The conductor 21B is preferably, for example, an L-shaped conductor disposed near a second corner (a lower right corner of the insulating base material layer 11a in FIG. 3) of the insulating base material layer 11a. The conductor 22A is preferably, for example, an L-shaped conductor disposed near a third corner (an upper left corner of the insulating base material layer 11a in FIG. 3) of the insulating base material layer 11a. The conductor 22B is preferably, for example, an L-shaped conductor disposed near a fourth corner (an upper right corner of the insulating base material layer 11a in FIG. 3) of the insulating base material layer 11a. The conductors 21A, 21B, 22A, and 22B are preferably conductor patterns such as Cu foil, for example.

In addition, the external electrodes P1, P2, P3, and P4 are provided on the back surface of the insulating base material layer 11a. The external electrodes P1, P2, P3, and P4 are preferably, for example, rectangular or substantially rectangular conductors disposed near the center of the insulating base material layer 11a. The external electrodes P1, P2, P3, and P4 are preferably conductor patterns such as Cu foil, for example.

Furthermore, interlayer connection conductors V1, V2, V3, and V4 are provided on the insulating base material layer 11a.

Coil conductors 31A and 31B, connection conductors 61A, 61B, 63A, and 63B, and conductors 41, 42, 43, 44, 51A, 51B, 52A, and 52B are provided on a surface of the insulating base material layer 12a. The coil conductor 31A is preferably, for example, a substantially 1.5-turn rectangular spiral conductor disposed at a position closer to a first side (a left side of the insulating base material layer 12a in FIG. 3) than to the center of the insulating base material layer 12a. The coil conductor 31B is preferably, for example, a substantially 1.5-turn rectangular spiral conductor disposed at a position closer to a second side (a right side of the insulating base material layer 12a in FIG. 3) than to the center of the insulating base material layer 12a. The connection conductors 61A and 61B are linear conductors disposed near a third side (a lower side of the insulating base material layer 12a in FIG. 3) of the insulating base material layer 12a and extending in the X-axis direction. The connection conductors 63A and 63B are linear conductors disposed near a fourth side (an upper side of the insulating base material layer 12a in FIG. 3) of the insulating base material layer 12a and extending in the X-axis direction. The conductors 41, 42, 43, 44, 51A, 51B, 52A, and 52B are preferably, for example, rectangular or substantially rectangular conductors disposed near the center of the insulating base material layer 12a. The coil conductors 31A and 31B, the connection conductors 61A, 61B, 63A, and 63B, and the conductors 41, 42, 43, 44, 51A, 51B, 52A, and 52B are preferably conductor patterns such as Cu foil, for example.

In addition, the insulating base material layer 12a includes interlayer connection conductors V21A, V21B, V22A, V22B, V41, V42, V43 and V44, and openings AP3A and AP3B. The opening AP3A is a through hole having a shape corresponding to the plane shape of the magnetic sensor 2A. The opening AP3B is a through hole having a shape corresponding to the plane shape of the magnetic sensor 2B. The openings AP3A and AP3B are preferably formed by laser processing or other suitable method, for example. Alternatively, the openings AP3A and AP3B may be formed using die-cutting techniques, such as punching or other suitable method, for example.

Coil conductors 32A and 32B, and connection conductors 62A and 62B are provided on a surface of the insulating base material layer 13a. The coil conductor 32A is preferably, for example, a substantially 2-turn rectangular spiral conductor disposed at a position closer to a first side (a left side of the insulating base material layer 13a in FIG. 3) than to the center of the insulating base material layer 13a. The coil conductor 32B is preferably, for example, a substantially 2-turn rectangular spiral conductor disposed at a position closer to a second side (a right side of the insulating base material layer 13a in FIG. 3) than to the center of the insulating base material layer 13a. The connection conductors 62A and 62B are linear conductors extending in the Y-axis direction. The coil conductors 32A and 32B, and the connection conductors 62A and 62B are preferably conductor patterns such as Cu foil, for example.

In addition, the insulating base material layer 13a includes interlayer connection conductors V31A, V31B, V32A, and V32B, and openings AP1, AP2A, and AP2B. The opening AP1 is a through hole having a shape corresponding to the plane shape of the driver IC 1. The opening AP2A is a through hole having a shape corresponding to the plane shape of the magnetic sensor 2A. The opening AP2B is a through hole having a shape corresponding to the plane shape of the magnetic sensor 2B. The openings AP1, AP2A, and AP2B are preferably formed by laser processing or other suitable method, for example. Alternatively, the openings AP1, AP2A, and AP2B may be formed using die-cutting techniques such as punching or other suitable method, for example.

In the first preferred embodiment, as shown in FIGS. 2A and 2B, a portion of the driver IC 1 is embedded in the stacked body 10A, and the mounting surface (the lower surface of the driver IC 1 in FIG. 2A) of the driver IC 1 faces the surface (the upper surface of the insulating base material layer 12a in FIG. 2A) of the insulating base material layer 12a. The plurality of mounting electrodes (the mounting electrodes MP1 to MP12 shown in FIG. 1) of the driver IC 1, through a conductive bonding material 4, are connected to the conductors (connection electrodes CP1A, CP1B, CP2A, and CP2B, and the conductors 41, 42, 43, 44, 51A, 51B, 52A, and 52B that are shown in FIG. 3) provided on the surface of the insulating base material layer 12a, respectively. The conductive bonding material 4 preferably includes solder, for example.

As shown mainly in FIG. 2A, FIG. 2B, and FIG. 3, a first end of the coil conductor 31A is connected to a first end of the coil conductor 32A through the interlayer connection conductor V31A. In such a manner, the coil conductors 31A and 32A respectively provided on the plurality of insulating base material layers 12a and 13a, and the interlayer connection conductor V31A define a coil 3A preferably including about 3.5 turns, for example. The coil 3A, as shown in FIG. 2B, includes a winding axis AX1A in a stacking direction (the Z-axis direction) of the plurality of insulating base material layers 11a, 12a, and 13a.

The coil 3A includes a first end E1A and a second end E2A, where the first end E1A is electrically connected to one of the mounting electrodes of the driver IC 1, and the second end E2A is electrically connected to another one of the mounting electrodes of the driver IC 1. Specifically, the first end E1A (a second end of the coil conductor 31A) of the coil 3A is connected to a first end of the connection conductor 61A. A second end (a connection electrode CP1A) of the connection conductor 61A is connected to a mounting electrode (the mounting electrode MP5 shown in FIG. 1) of the driver IC 1 through the conductive bonding material 4. In addition, the second end E2A (a second end of the coil conductor 32A) of the coil 3A is connected to a first end of the connection conductor 62A, and a second end of the connection conductor 62A is connected to a first end of the connection conductor 63A through the interlayer connection conductor V32A. A second end (a connection electrode CP2A) of the connection conductor 63A is connected to a mounting electrode (the mounting electrode MP6 in FIG. 1) of the driver IC 1 through the conductive bonding material 4. As shown mainly in FIG. 2A, FIG. 2B, and FIG. 3, the first end E1A of the coil 3A and the mounting electrode (MP5) are connected at one position through the conductive bonding material 4.

In addition, as shown mainly in FIG. 2A, FIG. 2B, and FIG. 3, a first end of the coil conductor 31B is connected to a first end of the coil conductor 32B through the interlayer connection conductor V31B. In such a manner, the coil conductors 31B and 32B respectively provided on the plurality of insulating base material layers 12a and 13a, and the interlayer connection conductor V31B define a coil 3B preferably including about 3.5 turns, for example. As shown in FIG. 2B, the coil 3B includes a winding axis AX1B in the Z-axis direction.

In addition, the coil 3B includes a first end E1B and a second end E2B, where the first end E1B is electrically connected to one of the mounting electrodes of the driver IC 1, and the second end E2B is electrically connected to another one of the mounting electrodes of the driver IC 1. Specifically, the first end E1B (a second end of the coil conductor 31B) of the coil 3B is connected to a first end of the connection conductor 61B. A second end (a connection electrode CP1B) of the connection conductor 61B is connected to a mounting electrode (the mounting electrode MP7 shown in FIG. 1) of the driver IC 1 through the conductive bonding material 4. In addition, the second end E2B (a second end of the coil conductor 32B) of the coil 3B is connected to a first end of the connection conductor 62B, and a second end of the connection conductor 62B is connected to a first end of the connection conductor 63B through the interlayer connection conductor V32B. A second end (a connection electrode CP2B) of the connection conductor 63B is connected to a mounting electrode (the mounting electrode MP8 in FIG. 1) of the driver IC 1 through the conductive bonding material 4. As shown mainly in FIG. 2A, the first end E1B of the coil 3B and the mounting electrode (MP7) are connected at one position through the conductive bonding material 4.

It is to be noted that, while the first preferred embodiment of the present invention provides an example in which the winding axis AX1A of the coil 3A and the winding axis AX1B of the coil 3B coincide with the Z-axis direction, the winding axis AX1A (or the winding axis AX1B of the coil 3B) of the coil 3A and the Z-axis direction are not required to strictly coincide with each other. In various preferred embodiments of the present invention, "the winding axis in the stacking direction of the plurality of insulating base material layers" includes an example in which the winding axis AX1A of the coil 3A (or the winding axis AX1B of the coil 3B) extends in a range from about minus 30 degrees to about plus 30 degrees with respect to the Z-axis direction, for example.

The magnetic sensor 2A is connected to the driver IC 1. Specifically, the magnetic sensor 2A includes terminals on the mounting surface (the lower surface of the magnetic sensor 2A in FIG. 2A), and the terminals of the magnetic sensor 2A are connected to first ends of the conductors 21A and 22A through the conductive bonding material 4, respectively. A second end of the conductor 21A is connected to a mounting electrode (the mounting electrode MP9 in FIG. 1) of the driver IC 1 through the conductor 51A, the interlayer connection conductor V21A, and the conductive bonding material 4. A second end of the conductor 22A is connected to a mounting electrode (the mounting electrode MP10 in FIG. 1) of the driver IC 1 through the conductor 52A, the interlayer connection conductor V22A, and the conductive bonding material 4.

The magnetic sensor 2B is connected to the driver IC 1. Specifically, the magnetic sensor 2B includes terminals on the mounting surface (the lower surface of the magnetic sensor 2B in FIG. 2A), and the terminals of the magnetic sensor 2B are connected to first ends of the conductors 21B and 22B through the conductive bonding material 4, respectively. A second end of the conductor 21B is connected to a mounting electrode (the mounting electrode MP11 in FIG. 1) of the driver IC 1 through the conductor 51B, the interlayer connection conductor V21B, and the conductive bonding material 4. A second end of the conductor 22B is connected to a mounting electrode (the mounting electrode MP12 in FIG. 1) of the driver IC 1 through the conductor 52B, the interlayer connection conductor V22B, and the conductive bonding material 4.

It is to be noted that, while the various preferred embodiments of the present invention provide an example in which the magnetic sensor includes two terminals, the magnetic sensor may include three or four terminals.

In addition, the external electrodes P1, P2, P3, and P4 are connected to the mounting electrodes of the driver IC 1, respectively. Specifically, the external electrode P1 is connected to the conductor 41 through the interlayer connection conductors V1 and V41, and the conductor 41 is connected to a mounting electrode (the mounting electrode MP1 shown in FIG. 1) of the driver IC 1 through the conductive bonding material 4. The external electrode P2 is connected to the conductor 42 through the interlayer connection conductors V2 and V42, and the conductor 42 is connected to a mounting electrode (the mounting electrode MP2 shown in FIG. 1) of the driver IC 1 through the conductive bonding material 4. The external electrode P3 is connected to the conductor 43 through the interlayer connection conductors V3 and V43, and the conductor 43 is connected to a mounting electrode (the mounting electrode MP3 shown in FIG. 1) of the driver IC 1 through the conductive bonding material 4. The external electrode P4 is connected to the conductor 44 through the interlayer connection conductors V4 and V44, and the conductor 44 is connected to a mounting electrode (the mounting electrode MP4 shown in FIG. 1) of the driver IC 1 through the conductive bonding material 4.

Figure 4:
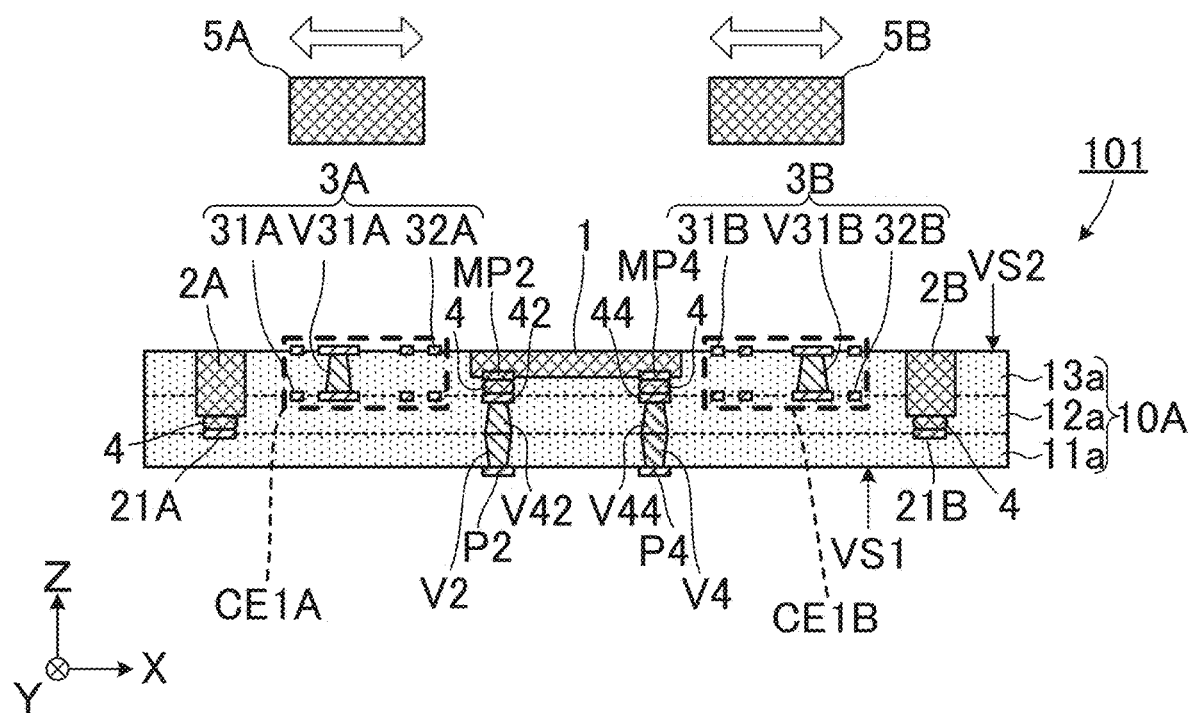
FIG. 4 is a cross-sectional view of a state in which the multilayer substrate 101 is used.

The multilayer substrate 101 is used, for example, as follows. FIG. 4 is a cross-sectional view of a state in which the multilayer substrate 101 is used.

FIG. 4 shows magnets 5A and 5B that are attached to the movable body (not shown). When a predetermined current flows into the coils 3A and 3B, the magnets 5A and 5B are displaced (see the white arrow in FIG. 4), due to a magnetic field emitted from the coils 3A and 3B, in a direction (the Y-axis direction) perpendicular or substantially perpendicular to the stacking direction (the Z-axis direction). The magnetic sensors 2A and 2B sense a change in the magnetic field when the magnets 5A and 5B are displaced.

According to the multilayer substrate 101 of the first preferred embodiment of the present invention, the following advantageous effects are obtained.

(a) In the multilayer substrate 101, as shown in FIG. 2A, the coils 3A and 3B are provided in the stacked body 10A, and the first end E1A (the second end of the coil conductor 31A) of the coil 3A and the mounting electrode (MP5) are connected at one position through the conductive bonding material 4. In addition, the first end E1B (the second end of the coil conductor 31B) of the coil 3B and the mounting electrode (MP7) are connected at one position through the conductive bonding material 4. With this configuration, compared with a case in which the first end of the coil and the mounting electrode are connected at two or more positions through the conductive bonding material 4 (a case in which the driver IC and the coils, which are chip components, are separately mounted to a substrate or a similar component through the conductive bonding material, for example), the positional relationship between the driver IC 1 and the coils 3A and 3B is difficult to shift. Accordingly, with this configuration, the variations of generated magnetic fields due to the shift of the positional relationship between the driver IC 1 and the coils are able to be reduced.

(b) In addition, in the multilayer substrate 101, the plurality of insulating base material layers 11a, 12a, and 13a defining the stacked body 10A are preferably made of a resin material. As shown in FIG. 1 and FIG. 2B, at least a portion of the driver IC 1 is disposed between a region CE1A (a region in which the coil 3A is defined) in which a coil is defined, and a region CE1B (a region in which the coil 3B is defined) in which a coil is defined). Generally, a conductor, such as a coil, for example, has relatively higher rigidity than an insulating base material layer made of a resin material. In other words, in the multilayer substrate 101, since the driver IC 1 is held (surrounded) by elements having relatively higher rigidity than the insulating base material layer made of a resin material, the shift of the positional relationship between the driver IC 1 and the coils is reduced even when external forces are applied to the stacked body 10A.

(c) In the multilayer substrate 101, the plurality of insulating base material layers 11a, 12a, and 13a are preferably made of a resin material of a thermoplastic resin. While the driver IC 1 is disposed in a cavity (to be described in detail later) defined by the plurality of insulating base material layers 11a, 12a, and 13a, in this configuration, the insulating base material layers flow when being heated and pressed at a time of forming the stacked body 10A, and the flowing insulating base material layers partially flow into the cavity. Therefore, the generation of a gap in the cavity is reduced, and the driver IC 1 of which a portion is embedded in the stacked body 10A is easily fixed. Accordingly, electrical reliability of connection between the driver IC 1 and the conductors in the stacked body 10A is improved.

In addition, according to this configuration, as will be described in detail later, since the multilayer substrate 101 (the stacked body 10A) is able to be easily formed by collectively pressing the stacked insulating base material layers 11a, 12a, and 13a, the number of manufacturing steps and the cost are able to be reduced.

It is to be noted that, while the multilayer substrate 101 provides an example in which a portion of the driver IC 1 and a portion of the magnetic sensors 2A and 2B are embedded in the stacked body 10A, the present invention is not limited to this configuration. The driver IC 1 and the magnetic sensors 2A and 2B may be mounted after the stacked body 10A is provided. For example, in a case in which a magnetic sensor defined by a package having low rigidity is embedded in the stacked body 10A, the stress generated by external forces applied to the stacked body 10A is easily transmitted, and the characteristics of the magnetic sensors may change. Therefore, in some cases, the driver IC or the magnetic sensor may preferably not be embedded in the stacked body so that the stress may not be easily transmitted.

The multilayer substrate 101 according to the first preferred embodiment is preferably manufactured by, for example, the following process. FIG. 5 is a cross-sectional view sequentially showing a process of manufacturing the multilayer substrate 101. It is to be noted that, in FIG. 5, for the sake of convenience of explanation, although explanation will be provided in a manufacturing process for one chip (an individual piece), the actual process of manufacturing the multilayer substrate is performed in a collective substrate state.

As shown in (1) in FIG. 5, first, the plurality of insulating base material layers 11a, 12a, and 13a are prepared. The insulating base material layers 11a, 12a, and 13a are preferably thermoplastic resin sheets such as a liquid crystal polymer (LCP) or polyetheretherketone (PEEK), for example.

Subsequently, the coil conductors 31A, 31B, 32A, 32B, and the like, the connection conductors, the external electrodes P2, P4, and the like, the conductors 21A, 21B, 42, 44, and the like, are provided on the insulating base material layers 11a, 12a, and 13a.

Specifically, metal foil (copper foil, for example) is laminated on first and second principal surfaces of the insulating base material layer 11a in the collective substrate state and then patterned by photolithography to form the external electrodes P2, P4, and the like, and the conductors 21A, 21B, and the like. In addition, metal foil (copper foil, for example) is laminated on a first principal surface of the insulating base material layer 12a in the collective substrate state and patterned by photolithography to form the coil conductors 31A, 31B, and the like, the connection conductors, and the conductors 42, 44, and the like. Moreover, metal foil (copper foil, for example) is laminated on a first principal surface of the insulating base material layer 13a in the collective substrate state and then patterned by photolithography to form the coil conductors 32A, 32B, and the like, and the connection conductors.

Next, the driver IC 1 and the magnetic sensors 2A and 2B are mounted to the insulating base material layer 12a. Specifically, the driver IC 1 includes a plurality of mounting electrodes on the mounting surface (the lower surface of the driver IC 1 in FIG. 5), and the plurality of mounting electrodes, through the conductive bonding material 4, are connected to the conductors (the connection electrodes CP1A, CP1B, CP2A, and CP2B, and the conductors 41, 42, 43, 44, 51A, 51B, 52A, and 52B that are shown in FIG. 3) provided on the surface of the insulating base material layer 12a. In addition, the magnetic sensors 2A and 2B include terminals on the mounting surface (the lower surface of the magnetic sensors 2A and 2B in FIG. 5), and the terminals, through the conductive bonding material 4, are connected to the conductors provided on the surface of the insulating base material layer 12a. It is to be noted that the conductive bonding material 4, since having a possibility to melt in the subsequent heating and pressing and to cause a connection failure, is preferably made of a material having a melting point (a melting temperature) higher than a temperature at the time of the heating and pressing.

The driver IC 1 moves the magnet attached to the movable body by controlling a power supply of the coils. The magnetic sensors 2A and 2B are preferably Hall elements using the Hall effect, for example.

It is to be noted that the interlayer connection conductors V2, V4, V31A, V31B, V42, V44, and the like are provided on the plurality of insulating base material layers 11a, 12a, and 13a. The interlayer connection conductors are provided by forming a through hole on the plurality of insulating base material layers 11a, 12a, and 13a with a laser or other suitable method, for example, then providing (filling) a conductive paste preferably including one or more of Cu, Ag, Sn, Ni, and Mo or an alloy preferably including one or more of Cu, Ag, Sn, Ni, and Mo, for example, and curing (solidifying) the conductive paste through the subsequent heating and pressing. Therefore, the interlayer connection conductors are preferably made of a material having a melting point (a melting temperature) lower than the temperature at the time of the subsequent heating and pressing.

In addition, the openings AP1, AP2A, AP2B, AP3A, and AP3B are formed in the insulating base material layers 12a and 13a. The opening AP1 is a through hole having a shape corresponding to the plane shape of the driver IC 1. The openings AP2A and AP3A are through holes having a shape corresponding to the plane shape of the magnetic sensor 2A. The openings AP2B and AP3B are through holes having a shape corresponding to the plane shape of the magnetic sensor 2B. The openings AP1, AP2A, AP2B, AP3A, and AP3B are preferably formed by laser processing or other suitable method, for example. Alternatively, the openings AP1, AP2A, AP2B, AP3A, and AP3B may be formed using die-cutting techniques such as punching or other suitable method.

Next, as shown in (2) and (3) in FIG. 5, the insulating base material layers 11a, 12a, and 13a are stacked in this order. At this time, a cavity corresponding to the shape of the driver IC 1 is provided inside the stacked insulating base material layers 11a, 12a, and 13a, and the driver IC 1 is disposed in this cavity. Further, cavities corresponding to the shape of the magnetic sensors 2A and 2B are provided inside the stacked insulating base material layers 11a, 12a, and 13a, and the magnetic sensors 2A and 2B are disposed in the cavities.

The plurality of insulating base material layers 11a, 12a, and 13a, after being stacked on each other, are heated and pressed to form a stacked body 10A in the collective substrate state. When the stacked body 10A is formed (during heating and pressing), a portion of the insulating base material layers 12a and 13a flows into the cavities, and a portion of the driver IC 1 and the magnetic sensors 2A and 2B is covered with a thermoplastic resin.

Lastly, the collective substrate is divided to separate individual pieces from each other to obtain a multilayer substrate 101.

With this manufacturing method, a multilayer substrate capable of reducing the variations of generated magnetic fields due to the shift of the positional relationship between the driver IC 1 and the coils is able to be easily manufactured.

In addition, according to this manufacturing method, since the multilayer substrate 101 (the stacked body 10A) is able to be easily formed by collectively pressing the stacked insulating base material layers 11a, 12a, and 13a, the number of manufacturing steps and the cost are able to be reduced.

It is to be noted that, while the driver IC 1 and the magnetic sensors 2A and 2B are mounted to the insulating base material layer 12a before heating and pressing in the manufacturing method, the present invention is not limited to this manufacturing method. The driver IC 1 and the magnetic sensors 2A and 2B may be mounted after the stacked body 10A is formed.

Second Preferred Embodiment

A second preferred embodiment of the present invention provides an example of a multilayer substrate in which the mounting electrodes of the driver IC are connected to the conductors provided on the insulating base material layers through a conductive bonding material other than solder.

Figure 6:
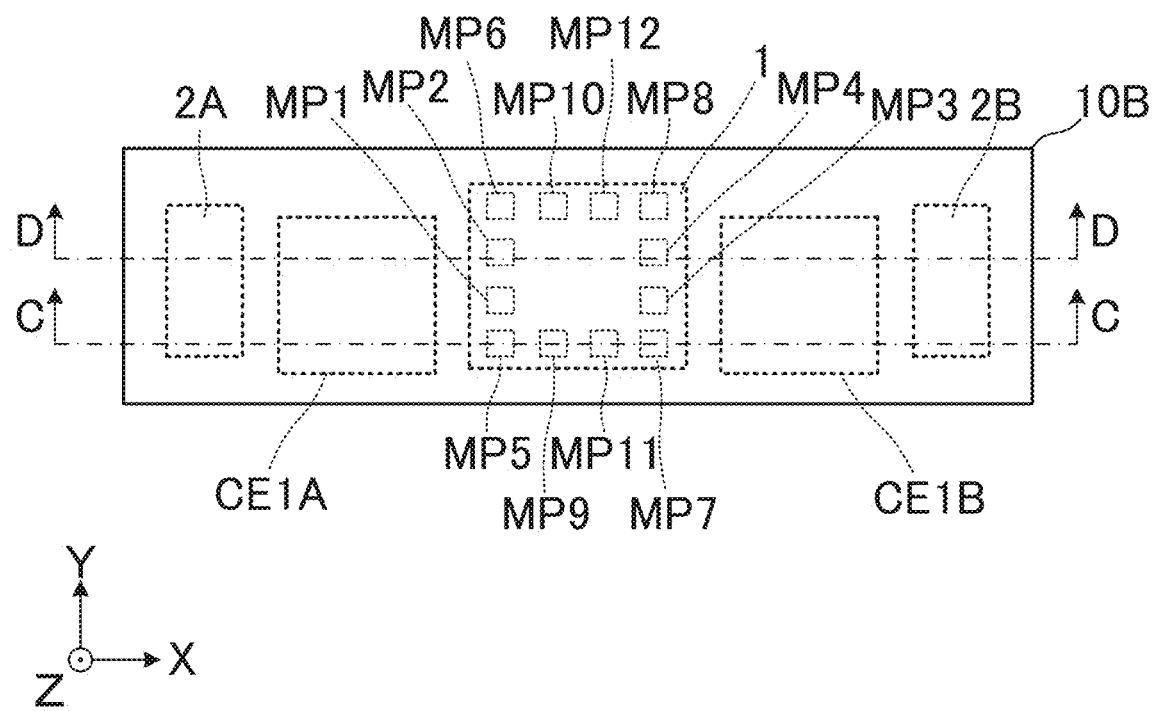
FIG. 6 is a plan view of a multilayer substrate 102 according to a second preferred embodiment of the present invention.
Figure 7A:
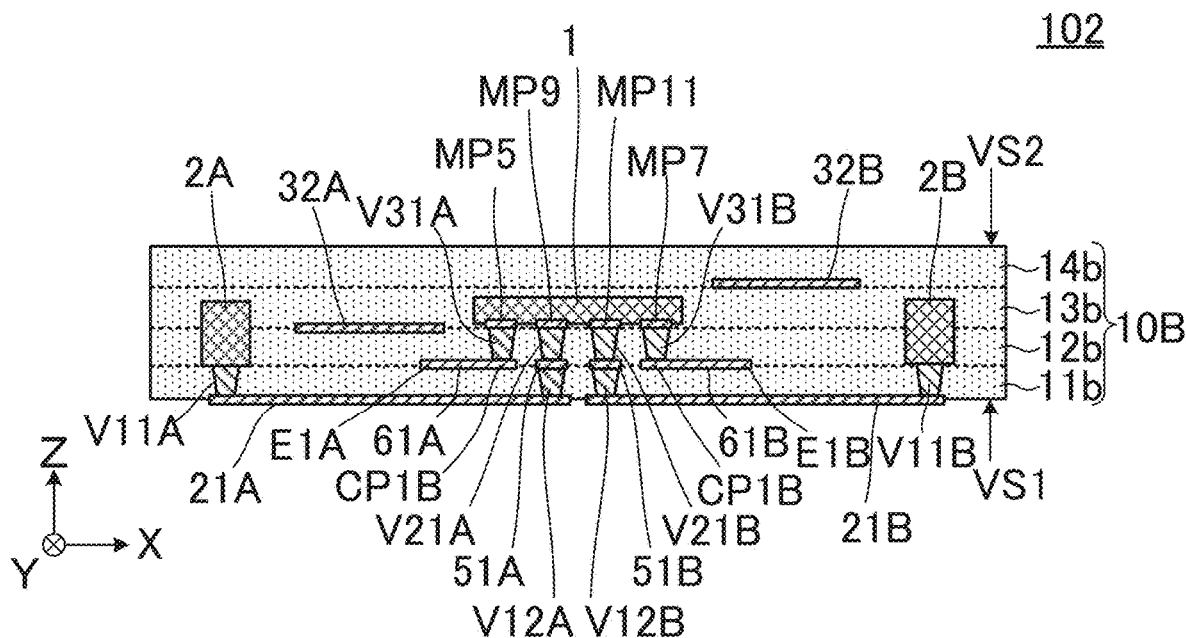
FIG. 7A is a C-C cross-sectional view in FIG. 6.
Figure 7B:
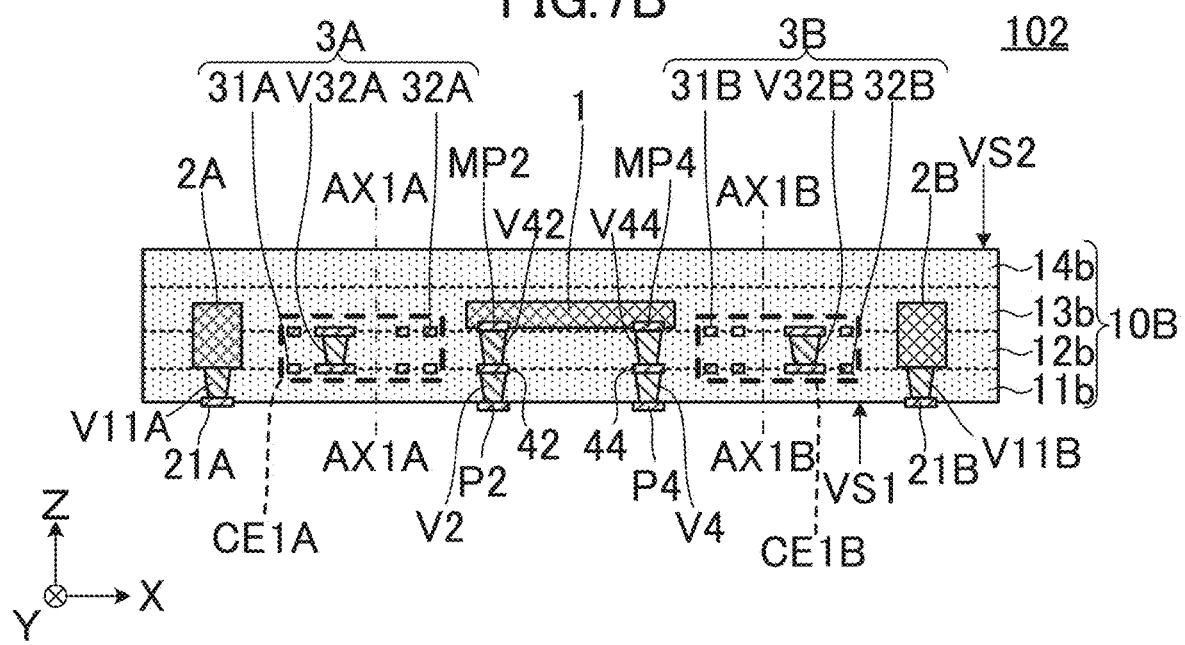
FIG. 7B is a D-D cross-sectional view in FIG. 6.
Figure 8:
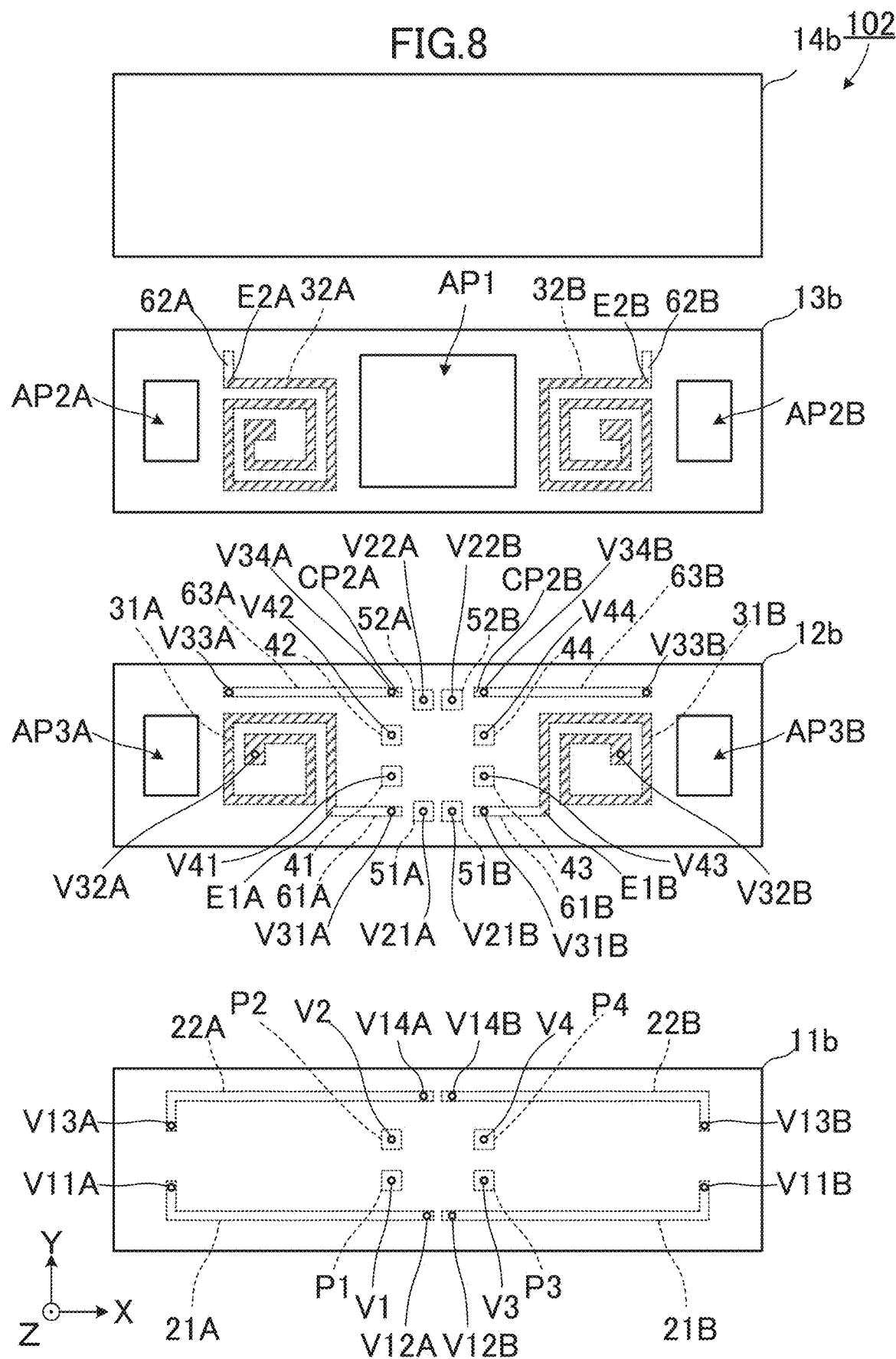
FIG. 8 is a plan view of each of base material layers 11b, 12b, 13b, and 14b of the multilayer substrate 102.

FIG. 6 is a plan view of a multilayer substrate 102 according to the second preferred embodiment of the present invention. FIG. 7A is a C-C cross-sectional view in FIG. 6, and FIG. 7B is a D-D cross-sectional view in FIG. 6. FIG. 8 is a plan view of each of base material layers 11b, 12b, 13b, and 14b of the multilayer substrate 102. In addition, in FIG. 8, in order to make the structure more understandable, coil conductors 31A, 31B, 32A, and 32B are indicated by hatching.

The multilayer substrate 102 includes a stacked body 10B, a driver IC 1, magnetic sensors 2A and 2B, and coils 3A and 3B (to be described in detail later) provided in the stacked body 10B.

The multilayer substrate 102 is different from the multilayer substrate 101 according to the first preferred embodiment of the present invention in the number of stacked layers of the stacked body 10B and the configuration of the conductors provided on a plurality of insulating base material layers. Other configurations are the same or substantially the same as the configurations of the multilayer substrate 101.

Hereinafter, differences from the multilayer substrate 101 according to the first preferred embodiment will be described.

The stacked body 10B is obtained by sequentially stacking a plurality of insulating base material layers 11b, 12b, 13b, and 14b that are preferably made of, for example, a resin material (a thermoplastic resin). The plurality of insulating base material layers 11b, 12b, 13b, and 14b as well as the insulating base material layers 11a, 12a, and 13a described in the first preferred embodiment are preferably sheets that are made of, for example, a liquid crystal polymer as a principal material.

External electrodes P1, P2, P3, and P4 and conductors 21A, 21B, 22A, and 22B are provided on the back surface of the insulating base material layer 11b. The configurations of the external electrodes P1, P2, P3, and P4 and the conductors 21A, 21B, 22A, and 22B are the same or substantially the same as the configurations described in the first preferred embodiment.

In addition, interlayer connection conductors V1, V2, V3, V4, V11A, V11B, V12A, V12B, V13A, V13B, V14A, and V14B are provided on the insulating base material layer 11b.

Coil conductors 31A and 31B, connection conductors 61A, 61B, 63A, and 63B, and conductors 41, 42, 43, 44, 51A, 51B, 52A, and 52B are provided on the back surface of the insulating base material layer 12b. The configurations of the coil conductors 31A and 31B, the connection conductors 61A, 61B, 63A, and 63B, and the conductors 41, 42, 43, 44, 51A, 51B, 52A, and 52B are the same or substantially the same as the configurations described in the first preferred embodiment.

In addition, the insulating base material layer 12b includes interlayer connection conductors V21A, V21B, V22A, V22B, V31A, V31B, V32A, V32B, V33A, V33B, V34A, V34B, V41, V42, V43, and V44, and openings AP3A and AP3B. The configurations of the openings AP3A and AP3B are the same or substantially the same as the configurations described in the first preferred embodiment.

Coil conductors 32A and 32B, and connection conductors 62A and 62B are provided on the back surface of the insulating base material layer 13b. The configurations of the coil conductors 32A and 32B and the connection conductors 62A and 62B are the same or substantially the same as the configurations described in the first preferred embodiment.

In addition, openings AP1, AP2A, and AP2B are provided in the insulating base material layer 13b. The configurations of the openings AP1, AP2A, and AP2B are the same or substantially the same as the configurations described in the first preferred embodiment.

In the second preferred embodiment, as shown in FIGS. 7A and 7B, a portion of the driver IC 1 is embedded in the stacked body 10B, and the mounting surface (the lower surface of the driver IC 1 in FIG. 7A) of the driver IC 1 faces the surface (the upper surface of the insulating base material layer 12b in FIG. 7A) of the insulating base material layer 12b. A plurality of mounting electrodes (mounting electrodes MP1 to MP12 shown in FIG. 6) of the driver IC 1, through the interlayer connection conductors V21A, V21B, V22A, V22B, V31A, V31B, V34A, V34B, V41, V42, V43, and V44, are connected to the conductors (the connection conductors 61A, 61B, 63A, and 63B and the conductors 41, 42, 43, 44, 51A, 51B, 52A, and 52B that are shown in FIG. 8) provided on the back surface of the insulating base material layer 12b, respectively.

As shown mainly in FIG. 7A, FIG. 7B, and FIG. 8, a first end of the coil conductor 31A is connected to a first end of the coil conductor 32A through the interlayer connection conductor V32A. In such a manner, the coil conductors 31A and 32A respectively provided on the plurality of insulating base material layers 12b and 13b, and the interlayer connection conductor V32A define a coil 3A preferably including about 3.5 turns.

The coil 3A includes a first end E1A and a second end E2A that are electrically connected to the mounting electrodes of the driver IC 1, respectively. Specifically, the first end E1A (a second end of the coil conductor 31A) of the coil 3A is connected to a first end of the connection conductor 61A. A second end (a connection electrode CP1A) of the connection conductor 61A is connected to a mounting electrode (the mounting electrode MP5 shown in FIG. 6) of the driver IC 1 through the interlayer connection conductor V31A. In addition, the second end E2A (a second end of the coil conductor 32A) of the coil 3A is connected to a first end of the connection conductor 62A, and a second end of the connection conductor 62A is connected to a first end of the connection conductor 63A through the interlayer connection conductor V33A. A second end (a connection electrode CP2A) of the connection conductor 63A is connected to a mounting electrode (the mounting electrode MP6 shown in FIG. 6) of the driver IC 1 through the interlayer connection conductor V34A.

In addition, as shown mainly in FIG. 7A, FIG. 7B, and FIG. 8, a first end of the coil conductor 31B is connected to a first end of the coil conductor 32B through the interlayer connection conductor V32B. In such a manner, the coil conductors 31B and 32B respectively provided on the plurality of insulating base material layers 12b and 13b, and the interlayer connection conductor V32B define a coil 3B preferably including about 3.5 turns.

In addition, the coil 3B includes a first end E1B and a second end E2B that are electrically connected to the mounting electrodes of the driver IC 1, respectively. Specifically, the first end E1B (a second end of the coil conductor 31B) of the coil 3B is connected to a first end of the connection conductor 61B. A second end (a connection electrode CP1B) of the connection conductor 61B is connected to a mounting electrode (the mounting electrode MP7 shown in FIG. 1) of the driver IC 1 through the interlayer connection conductor V31B. In addition, the second end E2B (a second end of the coil conductor 32B) of the coil 3B is connected to a first end of the connection conductor 62B, and a second end of the connection conductor 62B is connected to a first end of the connection conductor 63B through the interlayer connection conductor V33B. A second end (a connection electrode CP2B) of the connection conductor 63B is connected to a mounting electrode (the mounting electrode MP8 shown in FIG. 1) of the driver IC 1 through the interlayer connection conductor V34B.

The interlayer connection conductors V31A, V31B, V34A, and V34B, as will be described in detail later, are conductive bonding materials that are filled in holes penetrating through the insulating base material layer 12b. As shown mainly in FIG. 7A, the first end E1A of the coil 3A and the mounting electrode MP5 are connected at one position through the interlayer connection conductor (the conductive bonding material). In addition, the first end E1B of the coil 3B and the mounting electrode MP7 are connected at one position through the interlayer connection conductor (the conductive bonding material).

The magnetic sensor 2A includes terminals to be connected to the driver IC 1. Specifically, the terminals of the magnetic sensor 2A are connected to first ends of the conductors 21A and 22A through the interlayer connection conductors V11A and V13A, respectively. A second end of the conductor 21A is connected to a mounting electrode (the mounting electrode MP9 in FIG. 6) of the driver IC 1 through the conductor 51A and the interlayer connection conductors V12A and V21A. In addition, a second end of the conductor 22A is connected to a mounting electrode (the mounting electrode MP10 in FIG. 6) of the driver IC 1 through the conductor 52A and the interlayer connection conductors V14A and V22A.

The magnetic sensor 2B includes terminals to be connected to the driver IC 1. Specifically, the terminals of the magnetic sensor 2B are connected to first ends of the conductors 21B and 22B through the interlayer connection conductors V11B and V13B, respectively. A second end of the conductor 21B is connected to a mounting electrode (the mounting electrode MP11 in FIG. 6) of the driver IC 1 through the conductor 51B and the interlayer connection conductors V12B and V21B. In addition, a second end of the conductor 22B is connected to a mounting electrode (the mounting electrode MP12 in FIG. 6) of the driver IC 1 through the conductor 52B and the interlayer connection conductors V14B and V22B.

In addition, the external electrodes P1, P2, P3, and P4 are connected to the mounting electrodes of the driver IC 1, respectively. Specifically, the external electrode P1 is connected to a mounting electrode (the mounting electrode MP1 shown in FIG. 6) of the driver IC 1 through the conductor 41 and the interlayer connection conductors V1 and V41. The external electrode P2 is connected to a mounting electrode (the mounting electrode MP2 shown in FIG. 6) of the driver IC 1 through the conductor 42 and the interlayer connection conductors V2 and V42. The external electrode P3 is connected to a mounting electrode (the mounting electrode MP3 shown in FIG. 6) of the driver IC 1 through the conductor 43 and the interlayer connection conductors V3 and V43. The external electrode P4 is connected to a mounting electrode (the mounting electrode MP4 shown in FIG. 6) of the driver IC 1 through the conductor 44 and the interlayer connection conductors V4 and V44.

The multilayer substrate 102 according to the second preferred embodiment is preferably manufactured by, for example, the following process. FIG. 9 is a cross-sectional view sequentially showing a process of manufacturing the multilayer substrate 102. It is to be noted that, in FIG. 9, for the sake of convenience of explanation, although explanation will be provided in a manufacturing process for one chip (an individual piece), the actual process of manufacturing the multilayer substrate is performed in a collective substrate state.

As shown in (1) in FIG. 9, first, the plurality of insulating base material layers 11b, 12b, 13b, and 14b are prepared. The insulating base material layers 11b, 12b, 13b, and 14b are preferably thermoplastic resin sheets such as a liquid crystal polymer (LCP) or polyetheretherketone (PEEK), for example.

Subsequently, the coil conductors 31A, 31B, 32A, 32B, and the like, the connection conductors, the external electrodes P2, P4, and the like, the conductors 21A, 21B, 42, 44, and the like, are provided on the insulating base material layers 11b, 12b, and 13b.

Specifically, metal foil (copper foil, for example) is laminated on a second principal surface of the insulating base material layer 11b in the collective substrate state and then patterned by photolithography, for example, to form the external electrodes P2, P4, and the like, and the conductors 21A, 21B, and the like. In addition, metal foil (copper foil, for example) is laminated on a second principal surface of the insulating base material layer 12b in the collective substrate state and then patterned by photolithography, for example, to form the coil conductors 31A, 31B, and the like, the connection conductors, and the conductors 42, 44, and the like. Moreover, metal foil (copper foil, for example) is laminated on a second principal surface of the insulating base material layer 13b in the collective substrate state and then patterned by photolithography, for example, to form the coil conductors 32A, 32B, and the like, and the connection conductors.

It is to be noted that the interlayer connection conductors V2, V4, V11A, V11B, V32A, V32B, V42, V44, and the like are provided on the plurality of insulating base material layers 11b and 12b. The interlayer connection conductors are provided by forming a through hole on the plurality of insulating base material layers 11b and 12b with a laser or other suitable method, for example, then providing (filling) a conductive paste preferably including one or more of Cu, Ag, Sn, Ni, and Mo or an alloy preferably including one or more of Cu, Ag, Sn, Ni, and Mo, for example, and curing (solidifying) the conductive paste through the subsequent heating and pressing. Therefore, the interlayer connection conductors are preferably made of a material having a melting point (a melting temperature) lower than the temperature at the time of the subsequent heating and pressing.

In addition, the openings AP1, AP2A, AP2B, AP3A, and AP3B are formed in the insulating base material layers 12b and 13b. The opening AP1 is a through hole having a shape corresponding to the plane shape of the driver IC 1. The openings AP2A and AP3A are through holes having a shape corresponding to the plane shape of the magnetic sensor 2A. The openings AP2B and AP3B are through holes having a shape corresponding to the plane shape of the magnetic sensor 2B.

Next, as shown in (2) in FIG. 9, the insulating base material layers 11b, 12b, 13b, and 14b are stacked in this order. At this time, the opening AP1 provided in the insulating base material layer 13b and the plurality of insulating base material layers 12b and 14b define a cavity corresponding to the shape of the driver IC 1, inside the stacked insulating base material layers 11b, 12b, 13b, and 14b, and the driver IC 1 is disposed in the cavity. In addition, the opening AP2A, AP3A, AP2B, and AP3B provided in the insulating base material layers 12b and 13b, and the plurality of insulating base material layers 11b and 14b define cavities corresponding to the shape of the magnetic sensors 2A and 2B, inside the stacked insulating base material layers 11b, 12b, 13b, and 14b, and the magnetic sensors 2A and 2B are disposed in the cavities.

Subsequently, as shown in (2) and (3) in FIG. 9, the stacked insulating base material layers 11b, 12b, 13b, and 14b are heated and pressed (collectively pressed) to form a stacked body 10B in the collective substrate state. When the stacked body 10B is formed (during heating and pressing), a portion of the insulating base material layers 12b, 13b, and 14b flows into the cavities, and the entirety of the driver IC 1 and the entirety of the magnetic sensors 2A and 2B are covered with a thermoplastic resin.

Lastly, the collective substrate is divided to separate individual pieces from each other to obtain a multilayer substrate 102 shown in (3) in FIG. 9. It is to be noted that a protective film (a solder resist film and a coverlay film, for example) that covers conductors, such as the conductors 21A and 21B, may be provided on a second principal surface VS2 of the stacked body 10B.

According to the multilayer substrate 102 of the second preferred embodiment of the present invention, the following advantageous effects in addition to the advantageous effects described in the first preferred embodiment are obtained.

(a) In the multilayer substrate 102, the entirety of the driver IC 1 is covered with a thermoplastic resin. Therefore, the generation of a gap in the cavity that stores the driver IC 1 is further reduced, compared with a configuration in which a portion of the driver IC 1 is covered with a thermoplastic resin. Accordingly, with this configuration, electrical reliability of connection between the driver IC 1 and the conductors in the stacked body 10B is further improved.

(b) In addition, in the multilayer substrate 102, the entirety of the magnetic sensors 2A and 2B is covered with a thermoplastic resin. Therefore, the generation of a gap in the cavity that stores the magnetic sensors 2A and 2B is further reduced, compared with a configuration in which a portion of the magnetic sensors 2A and 2B is covered with a thermoplastic resin. Accordingly, with this configuration, electrical reliability of connection between the magnetic sensors 2A and 2B and the conductors in the stacked body 10B is further improved.

(c) In the multilayer substrate 102, it is not necessary to connect the driver IC 1 and the magnetic sensors 2A and 2B through a conductive bonding material, such as solder, for example. Accordingly, according to the manufacturing method, compared with the manufacturing method described in the first preferred embodiment, the number of manufacturing steps and the cost are able to be further reduced.

Third Preferred Embodiment

A third preferred embodiment of the present invention provides an example that is different from the first preferred embodiment in a configuration of a coil.

Figure 10A:
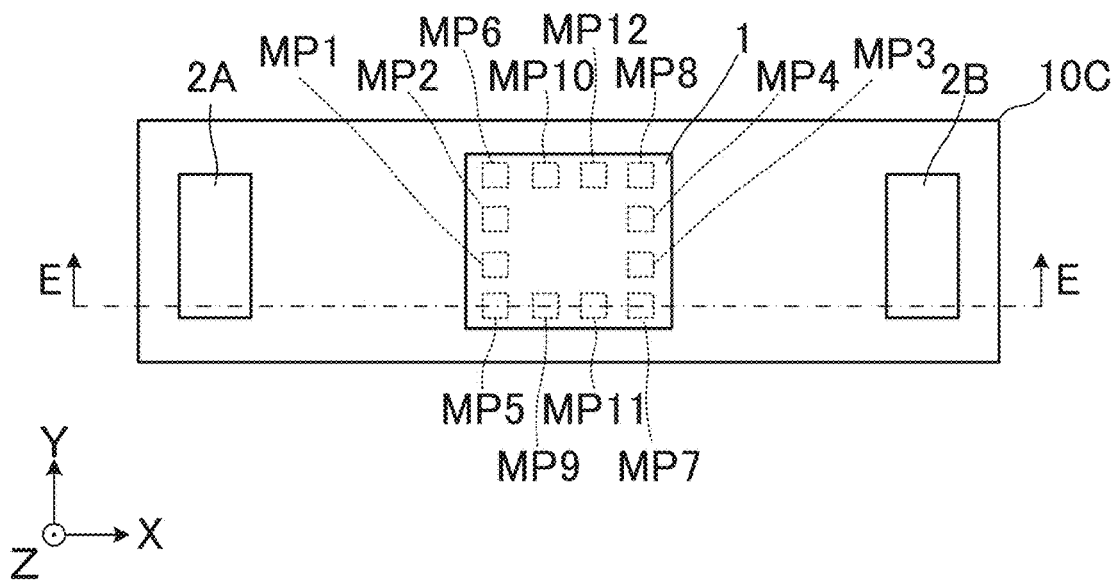
FIG. 10A is a plan view of a multilayer substrate 103 according to a third preferred embodiment of the present invention.
Figure 10B:
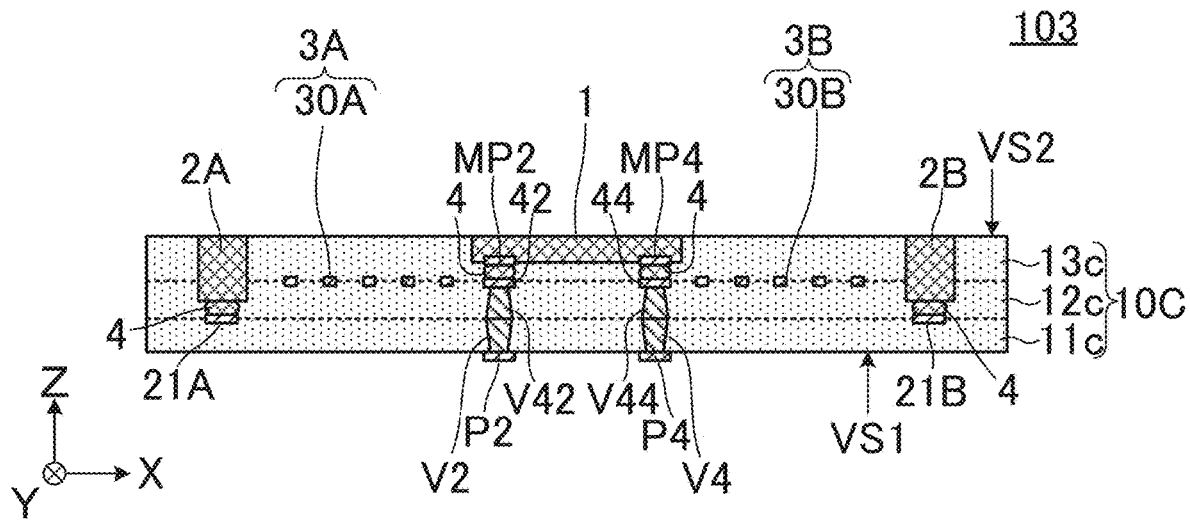
FIG. 10B is an E-E cross-sectional view in FIG. 10A.
Figure 11:
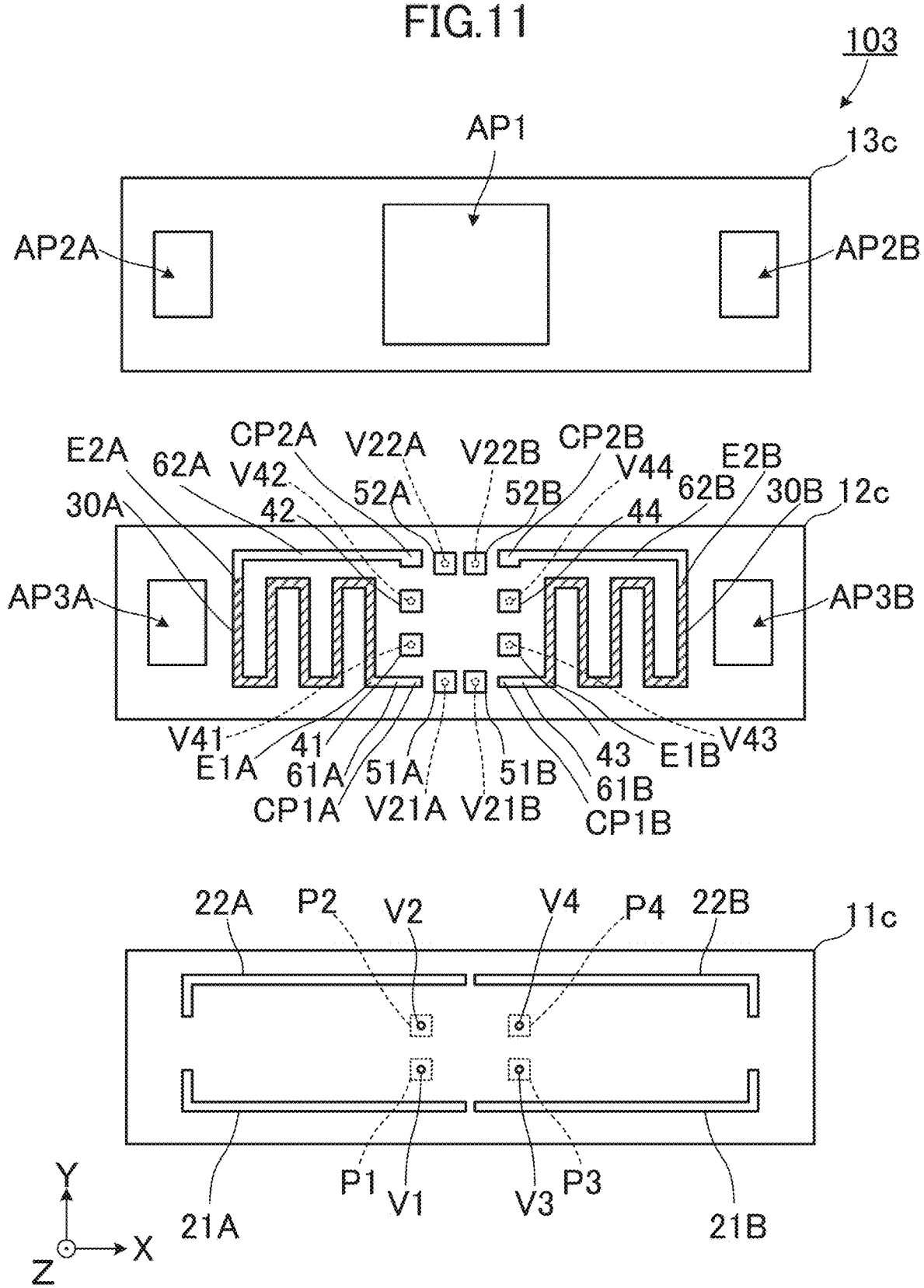
FIG. 11 is a plan view of each of base material layers 11c, 12c, and 13c of the multilayer substrate 103.

FIG. 10A is a plan view of a multilayer substrate 103 according to the third preferred embodiment of the present invention, and FIG. 10B is an E-E cross-sectional view in FIG. 10A. FIG. 11 is a plan view of each of base material layers 11c, 12c, and 13c of the multilayer substrate 103.

The multilayer substrate 103 includes a stacked body 10C, a driver IC 1, magnetic sensors 2A and 2B, and a plurality of coils 3A and 3B (to be described in detail later) provided in the stacked body 10C.

The multilayer substrate 103 is different from the multilayer substrate 101 according to the first preferred embodiment of the present invention in the configuration of the coils 3A and 3B. Other configurations are the same or substantially the same as the configurations of the multilayer substrate 101.

Hereinafter, differences from the multilayer substrate 101 according to the first preferred embodiment will be described.

The stacked body 10C is obtained by sequentially stacking a plurality of insulating base material layers 11c, 12c, and 13c that are preferably made of, for example, a resin material (a thermoplastic resin). The configurations of the plurality of insulating base material layers 11c, 12c, and 13c are the same or substantially the same as the configurations of the plurality of insulating base material layers 11a, 12a, and 13a described in the first preferred embodiment.

Conductors 21A, 21B, 22A, and 22B are provided on the front surface of the insulating base material layer 11c. External electrodes P1, P2, P3, and P4 are provided on the back surface of the insulating base material layer 11c. The configurations of the conductors 21A, 21B, 22A, and 22B and the external electrodes P1, P2, P3, and P4 are the same or substantially the same as the configurations described in the first preferred embodiment.

In addition, interlayer connection conductors V1, V2, V3, and V4 are provided in the insulating base material layer 11c.

Coil conductors 30A and 30B (coils 3A and 3B), connection conductors 61A, 61B, 62A, and 62B, and conductors 41, 42, 43, 44, 51A, 51B, 52A, and 52B are provided on a surface of the insulating base material layer 12c. The coil conductors 30A and 30B are meander line-shaped conductors extending in the longitudinal direction of the insulating base material layer 12c. The coil conductor 30A is disposed at a position closer to a first side (a left side of the insulating base material layer 12c in FIG. 11) than to the center of the insulating base material layer 12c. The coil conductor 30B is disposed at a position closer to a second side (a right side of the insulating base material layer 12c in FIG. 11) than to the center of the insulating base material layer 12c. The connection conductors 61A and 61B are linear conductors disposed near a third side (a lower side of the insulating base material layer 12c in FIG. 11) of the insulating base material layer 12c and extending in the X-axis direction. The connection conductors 62A and 62B are linear conductors disposed near a fourth side (an upper side of the insulating base material layer 12c in FIG. 11) of the insulating base material layer 12c and schematically extending in the X-axis direction. The configurations of the conductors 41, 42, 43, 44, 51A, 51B, 52A, and 52B are the same or substantially the same as the configurations described in the first preferred embodiment.

In addition, the insulating base material layer 12c includes interlayer connection conductors V21A, V21B, V22A, V22B, V41, V42, V43 and V44, and openings AP3A and AP3B. The configurations of the openings AP3A and AP3B are the same or substantially the same as the configurations described in the first preferred embodiment.

Openings AP1, AP2A, and AP2B are provided in the insulating base material layer 13c. The configurations of the openings AP1, AP2A, and AP2B are the same or substantially the same as the configurations described in the first preferred embodiment.

In the third preferred embodiment, as shown in FIG. 10B, a portion of the driver IC 1 is embedded in the stacked body 10C, and the mounting surface (the lower surface of the driver IC 1 in FIG. 10B) of the driver IC 1 faces the surface (the upper surface of the insulating base material layer 12c in FIG. 10B) of the insulating base material layer 12c. The plurality of mounting electrodes (the mounting electrodes MP1 to MP12 shown in FIG. 10A) of the driver IC 1, through a conductive bonding material 4, are connected to the conductors (connection electrodes CP1A, CP1B, CP2A, and CP2B, and the conductors 41, 42, 43, 44, 51A, 51B, 52A, and 52B that are shown in FIG. 11) provided on the surface of the insulating base material layer 12c, respectively.

The coil 3A (the coil conductor 30A) includes a first end E1A and a second end E2A, where the first end E1A is electrically connected to one of the mounting electrodes of the driver IC 1, and the second end E2A is electrically connected to another one of the mounting electrodes of the driver IC 1. Specifically, the first end E1A (a first end of the coil conductor 30A) of the coil 3A is connected to a mounting electrode (the mounting electrode MP5 shown in FIG. 10A) of the driver IC 1 through the conductive bonding material 4. In addition, the second end E2A (a second end of the coil conductor 30A) of the coil 3A is connected to a mounting electrode (the mounting electrode MP6 shown in FIG. 10A) of the driver IC 1 through the conductive bonding material 4. As shown in FIG. 10B and FIG. 11, the first end E1A of the coil 3A and the mounting electrode (MP5) are connected at one position through the conductive bonding material 4. In addition, the second end E2A of the coil 3A and the mounting electrode (MP6) are connected at one position through the conductive bonding material 4.

In addition, the coil 3B (the coil conductor 30B) includes a first end E1B and a second end E2B, where the first end E1B is electrically connected to one of the mounting electrodes of the driver IC 1, and the second end E2B is electrically connected to another one of the mounting electrodes of the driver IC 1. Specifically, the first end E1B (a first end of the coil conductor 30B) of the coil 3B is connected to a mounting electrode (the mounting electrode MP7 shown in FIG. 10A) of the driver IC 1 through the conductive bonding material 4. In addition, the second end E2B (a second end of the coil conductor 30B) of the coil 3B is connected to a mounting electrode (the mounting electrode MP8 shown in FIG. 10B) of the driver IC 1 through the conductive bonding material 4. As shown in FIG. 10B and FIG. 11, the first end E1B of the coil 3B and the mounting electrode (MP7) are connected at one position through the conductive bonding material 4. In addition, the second end E2B of the coil 3B and the mounting electrode (MP8) are connected at one position through the conductive bonding material 4.

According to the multilayer substrate 103 of the third preferred embodiment of the present invention, the following advantageous effects in addition to the advantageous effects described in the first preferred embodiment are obtained. (a) In the multilayer substrate 103, the second end E2A (the second end of the coil conductor 30A) of the coil 3A and the mounting electrode (MP6) are connected at one position through the conductive bonding material 4. In addition, the second end E2B (the second end of the coil conductor 30B) of the coil 3B and the mounting electrode (MP8) are connected at one position through the conductive bonding material 4. With this configuration, number of the position at which the first end of the coil and the mounting electrode are connected through the conductive bonding material and number of the position at which the second end of the coil and the mounting electrode are connected through the conductive bonding material are all one. Therefore, the shift of the positional relationship between the driver IC 1 and the coils 3A and 3B is further reduced.

Fourth Preferred Embodiment

A fourth preferred embodiment of the present invention provides an example that is different from each of the previously described preferred embodiments in a configuration of a coil.

Figure 12A:
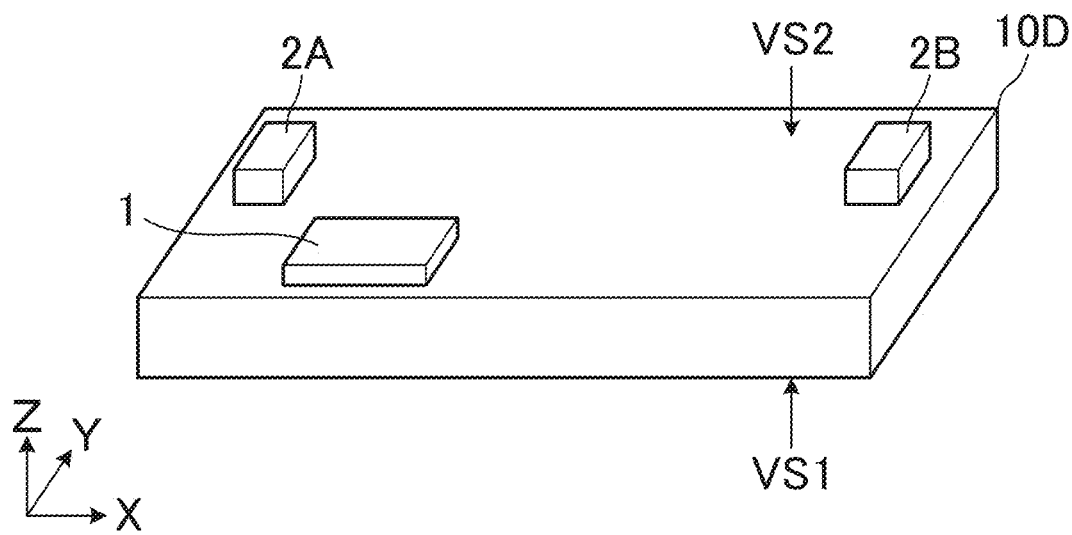
FIG. 12A is a perspective view of a multilayer substrate 104 according to a fourth preferred embodiment of the present invention.
Figure 12B:
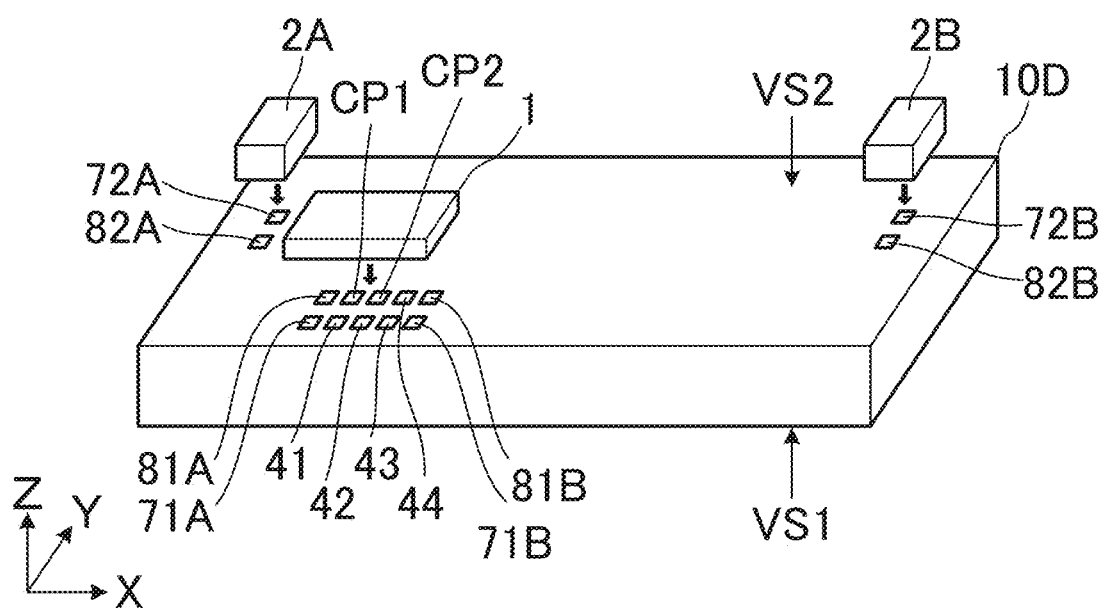
FIG. 12B is an exploded perspective view of the multilayer substrate 104.
Figure 13A:
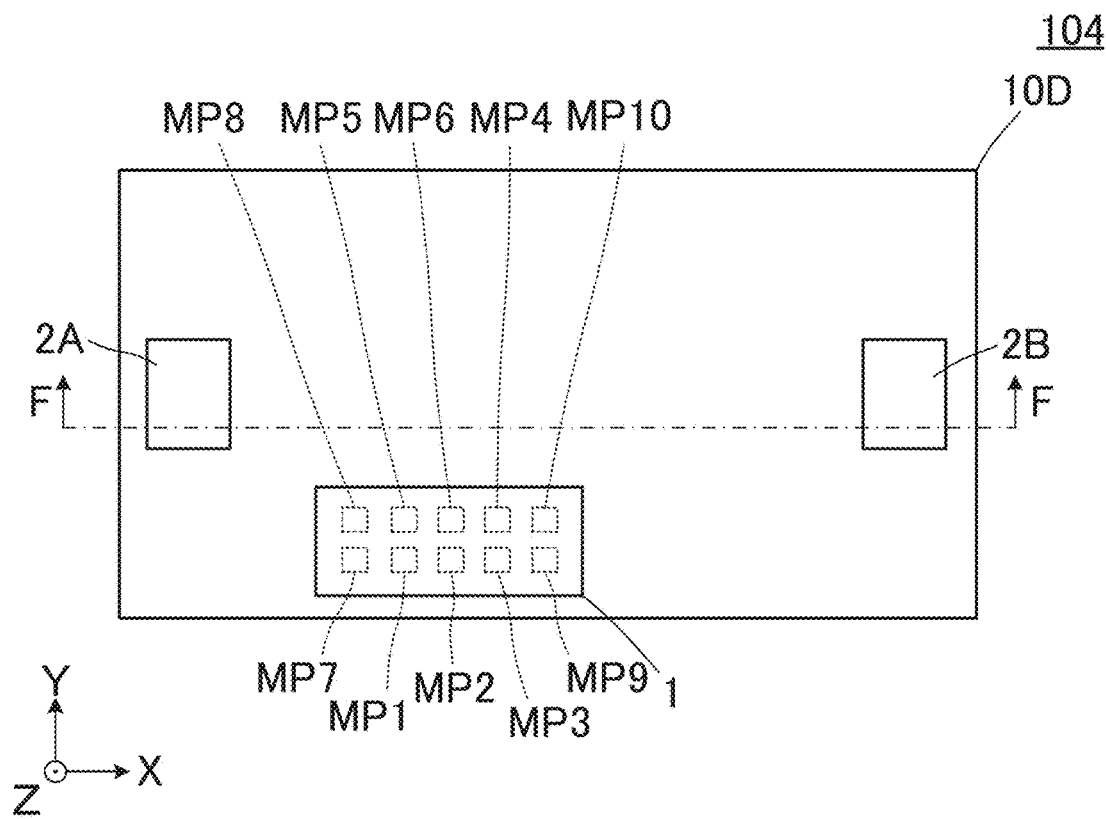
FIG. 13A is a plan view of the multilayer substrate 104.
Figure 13B:
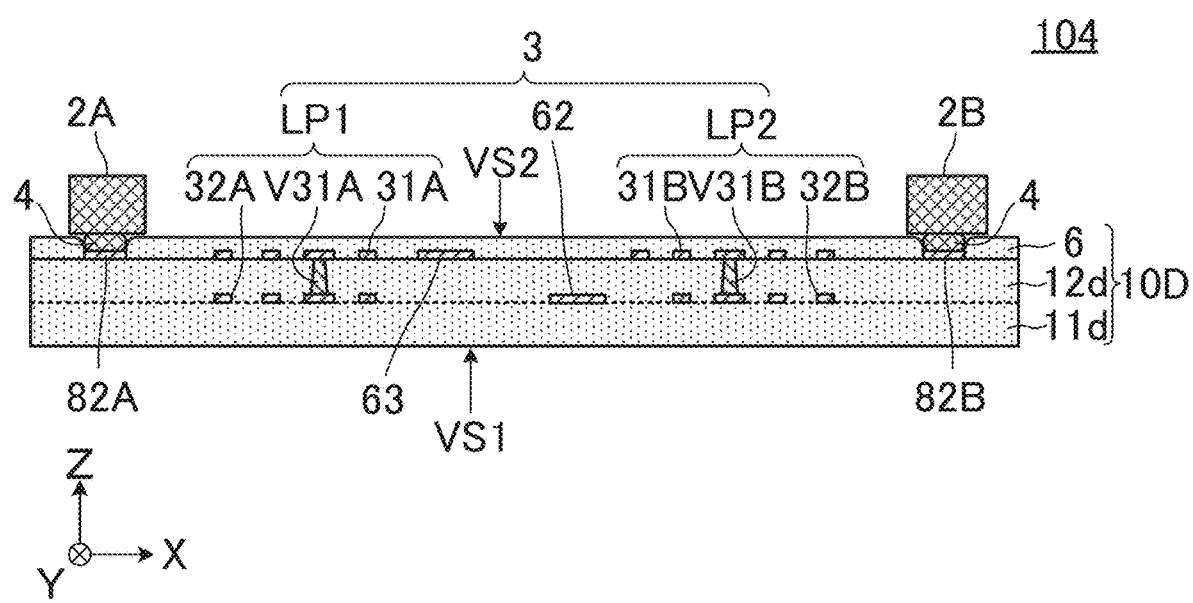
FIG. 13B is an F-F cross-sectional view in FIG. 13A.

FIG. 12A is a perspective view of a multilayer substrate 104 according to the fourth preferred embodiment of the present invention, and FIG. 12B is an exploded perspective view of the multilayer substrate 104. FIG. 13A is a plan view of the multilayer substrate 104, and FIG. 13B is an F-F cross-sectional view in FIG. 13A. FIG. 14 is a plan view of each of a protective layer 6 and base material layers 11d and 12d of the multilayer substrate 104. It is to be noted, in FIG. 14, in order to make structure more understandable, a first coil portion LP1 (the coil conductors 31A and 32A) is indicated by hatching, and a second coil portion LP2 (the coil conductors 31B and 32B) is indicated by cross-hatching.

The multilayer substrate 104 includes a stacked body 10D, a driver IC 1, magnetic sensors 2A and 2B, and a coil 3 (to be described in detail later) provided in the stacked body 10D.

The multilayer substrate 104 is different from the multilayer substrate 101 according to the first preferred embodiment of the present invention in the configuration of the coil 3. In addition, the multilayer substrate 104 is different from the multilayer substrate 101 in that the driver IC 1 and the magnetic sensors 2A and 2B are mounted to a second principal surface VS2 of the stacked body 10D. Other configurations are the same or substantially the same as the configurations of the multilayer substrate 101.

Hereinafter, differences from the multilayer substrate 101 according to the first preferred embodiment will be described.

The stacked body 10D is obtained by sequentially stacking a plurality of insulating base material layers 11d and 12d that are preferably made of, for example, a resin material (a thermoplastic resin) and a protective layer 6. The configurations of the plurality of insulating base material layers 11d and 12d are the same or substantially the same as the configurations of the plurality of insulating base material layers 11a, 12a, and 13a described in the first preferred embodiment. The protective layer 6 is preferably, for example, a solder resist film, a coverlay film, or the like.

Coil conductors 32A and 32B, and a connection conductor 62 are provided on a surface of the insulating base material layer 11d. The coil conductor 32A is preferably a substantially 2-turn rectangular spiral conductor disposed at a position closer to a first side (a left side of the insulating base material layer 11d in FIG. 14) than to the center of the insulating base material layer 11d. The coil conductor 32B is preferably a substantially 2-turn rectangular spiral conductor disposed at a position closer to a second side (a right side of the insulating base material layer 11d in FIG. 14) than to the center of the insulating base material layer 11d. The winding direction of the coil conductor 32A is opposite to the winding direction of the coil conductor 32B. The connection conductor 62 is a linear conductor. As shown in FIG. 14, a first end of the coil conductor 32A is connected to a first end of the coil conductor 32B through the connection conductor 62. The coil conductors 32A and 32B and the connection conductor 62 are preferably conductor patterns such as Cu foil, for example.

External electrodes P1, P2, P3, and P4 are provided on the back surface of the insulating base material layer 11d. The external electrodes P1, P2, P3, and P4 are preferably, for example, rectangular or substantially rectangular conductors disposed near a first corner (a lower left corner of the insulating base material layer 11d in FIG. 14) of the insulating base material layer 11d.

In addition, interlayer connection conductors V1, V2, V3, and V4 are provided on the insulating base material layer 11d.

Coil conductors 31A and 31B, connection conductors 61 and 63, and conductors 41, 42, 43, 44, 21A, 21B, 22A, and 22B are provided on a surface of the insulating base material layer 12d. The coil conductor 31A is preferably a substantially 1.5-turn rectangular spiral conductor disposed at a position closer to a first side (a left side of the insulating base material layer 12d in FIG. 14) than to the center of the insulating base material layer 12d. The coil conductor 31B is preferably a substantially 1.5-turn rectangular spiral conductor disposed at a position closer to a second side (a right side of the insulating base material layer 12d in FIG. 14) than to the center of the insulating base material layer 12d. The connection conductors 61 and 63 are linear conductors. The conductors 21A and 22A are preferably, for example, L-shaped conductors disposed near a first corner (a lower left corner of the insulating base material layer 12d in FIG. 14) of the insulating base material layer 12d. The conductors 21A and 22A are schematically parallel or substantially parallel to each other. The conductors 21B and 22B are preferably, for example, L-shaped conductors disposed near a second corner (a lower right corner of the insulating base material layer 12d in FIG. 14) of the insulating base material layer 12d. The conductors 21B and 22B are schematically parallel or substantially parallel to each other. The conductors 41, 42, 43, and 44 are preferably, for example, rectangular or substantially rectangular conductors disposed near the first corner of the insulating base material layer 12d. The coil conductors 31A and 31B, and the conductors 21A, 21B, 22A, 22B, 41, 42, 43, and 44 are preferably conductor patterns such as Cu foil, for example.

In the fourth preferred embodiment, the connection conductor 61 corresponds to the "first connection conductor".

The protective layer 6 is preferably a resin film, for example, disposed on the entirety or substantially the entirety of a surface (a surface on the side of the second principal surface VS2 of the stacked body 10D) of the insulating base material layer 12d and covering the conductors provided on the surface of the insulating base material layer 12d.

The protective layer 6 includes a plurality of opening portions OP1 at positions corresponding to a first end (a connection electrode CP1) of the connection conductor 61, a first end (a connection electrode CP2) of the connection conductor 63, a first end (an electrode portion 71A) of the conductor 21A, a first end (an electrode portion 81A) of the conductor 22A, a first end (an electrode portion 71B) of the conductor 21B, a first end (an electrode portion 81B) of the conductor 22B, and the conductors 41, 42, 43, and 44. Therefore, the protective layer 6 is provided on the upper surface of the insulating base material layer 12d, so that the connection electrodes CP1 and CP2, the electrode portions 71A, 71B, 81A, and 81B, and the conductors 41, 42, 43, and 44 are exposed from the second principal surface VS2 of the stacked body 10D.

In addition, the protective layer 6 includes a plurality of opening portions OP2 at positions corresponding to a second end (an electrode portion 72A) of the conductor 21A, and a second end (an electrode portion 82A) of the conductor 22A, and includes a plurality of opening portions OP3 at positions corresponding to a second end (an electrode portion 72B) of the conductor 21B, and a second end (an electrode portion 82B) of the conductor 22B. Therefore, the protective layer 6 is provided on the upper surface of the insulating base material layer 12d, so that the electrode portions 72A, 72B, 82A, and 82B are exposed from the second principal surface VS2 of the stacked body 10D.

In the fourth preferred embodiment, as shown in FIG. 12A, FIG. 12B, and FIG. 13B, the driver IC 1 is mounted to the second principal surface VS2 of the stacked body 10D. A plurality of mounting electrodes (mounting electrodes MP1 to MP10 shown in FIG. 13A) of the driver IC 1, through a conductive bonding material 4, are connected to the conductors (the connection electrodes CP1 and CP2, the electrode portions 71A, 71B, 81A, and 81B, and the conductors 41, 42, 43, and 44 that are shown in FIG. 14) exposed from the second principal surface VS2, respectively.

As mainly shown in FIG. 14, a first end of the coil conductor 31A is connected to a second end of the coil conductor 32A through the interlayer connection conductor V31A. In the fourth preferred embodiment, the coil conductors 31A and 32A respectively provided on the plurality of insulating base material layers 11d and 12d define a first coil portion LP1 including about 3.5 turns. In addition, a first end of the coil conductor 31B is connected to a second end of the coil conductor 32B through the interlayer connection conductor V31B. In the fourth preferred embodiment, the coil conductors 31B and 32B respectively provided on the plurality of insulating base material layers 11d and 12d define a second coil portion LP2 including about 3.5 turns. A first end (a first end of the coil conductor 32A) of the first coil portion LP1 is connected to a first end (a first end of the coil conductor 32B) of the second coil portion LP2 through the connection conductor 62. In such a manner, in the fourth preferred embodiment, the first coil portion LP1 and the second coil portion LP2 are connected in series.

As mainly shown in FIG. 13B, in the fourth preferred embodiment, the first coil portion LP1, the second coil portion LP2, and the connection conductor 62 define a coil 3.

As shown in FIG. 14, a first end E1 (a second end of the coil conductor 31A) of the coil 3 is connected to a first end of the connection conductor 61. A second end (a connection electrode CP1) of the connection conductor 61 is connected to a mounting electrode (the mounting electrode MP5 shown in FIG. 13A) of the driver IC 1 through the conductive bonding material 4. In other words, the connection conductor 61 connects the first end E1 of the coil 3, and the connection electrode CP1.

In the fourth preferred embodiment, the connection electrode CP1 corresponds to the "first connection electrode", and the connection conductor 61 corresponds to the "first connection conductor".

In addition, a second end E2 (a second end of the coil conductor 31B) of the coil 3 is connected to a first end of the connection conductor 63. A second end (a connection electrode CP2) of the connection conductor 63 is connected to a mounting electrode (the mounting electrode MP6 shown in FIG. 13A) of the driver IC 1 through the conductive bonding material 4. In other words, the connection conductor 63 connects the second end E2 of the coil 3, and the connection electrode CP2.

In the fourth preferred embodiment, the connection electrode CP2 corresponds to the "second connection electrode", and the connection conductor 63 corresponds to the "second connection conductor".

As shown in FIG. 14, the insulating base material layer includes a parallel portion CML, and the connection conductor 61 (the first connection conductor) and the connection conductor 63 (the second connection conductor) are parallel or substantially parallel to each other in the parallel portion CML so that the directions of currents are opposite to each other.

The magnetic sensor 2A includes terminals to be connected to the driver IC 1. Specifically, the terminals of the magnetic sensor 2A are connected to first ends of the conductors 21A and 22A through the conductive bonding material 4, respectively. A second end of the conductor 21A is connected to a mounting electrode (the mounting electrode MP7 shown in FIG. 13A) of the driver IC 1 through the conductive bonding material 4. In addition, a second end of the conductor 22A is connected to a mounting electrode (the mounting electrode MP8 shown in FIG. 13A) of the driver IC 1 through the conductive bonding material 4.

In addition, the magnetic sensor 2B includes terminals to be connected to the driver IC 1. Specifically, the terminals of the magnetic sensor 2B are connected to first ends of the conductors 21B and 22B through the conductive bonding material 4, respectively. A second end of the conductor 21B is connected to a mounting electrode (the mounting electrode MP9 shown in FIG. 13A) of the driver IC 1 through the conductive bonding material 4. In addition, a second end of the conductor 22B is connected to a mounting electrode (the mounting electrode MP10 shown in FIG. 13A) of the driver IC 1 through the conductive bonding material 4.

In addition, the external electrodes P1, P2, P3, and P4 are connected to the mounting electrodes of the driver IC 1, respectively. Specifically, the external electrode P1 is connected to the conductor 41 through the interlayer connection conductors V1 and V41, and the conductor 41 is connected to a mounting electrode (the mounting electrode MP1 shown in FIG. 13A) of the driver IC 1 through the conductive bonding material 4. The external electrode P2 is connected to the conductor 42 through the interlayer connection conductors V2 and V42, and the conductor 42 is connected to a mounting electrode (the mounting electrode MP2 shown in FIG. 13A) of the driver IC 1 through the conductive bonding material 4. The external electrode P3 is connected to the conductor 43 through the interlayer connection conductors V3 and V43, and the conductor 43 is connected to a mounting electrode (the mounting electrode MP3 shown in FIG. 13A) of the driver IC 1 through the conductive bonding material 4. The external electrode P4 is connected to the conductor 44 through the interlayer connection conductors V4 and V44, and the conductor 44 is connected to a mounting electrode (the mounting electrode MP4 shown in FIG. 13A) of the driver IC 1 through the conductive bonding material 4.

Figure 15:
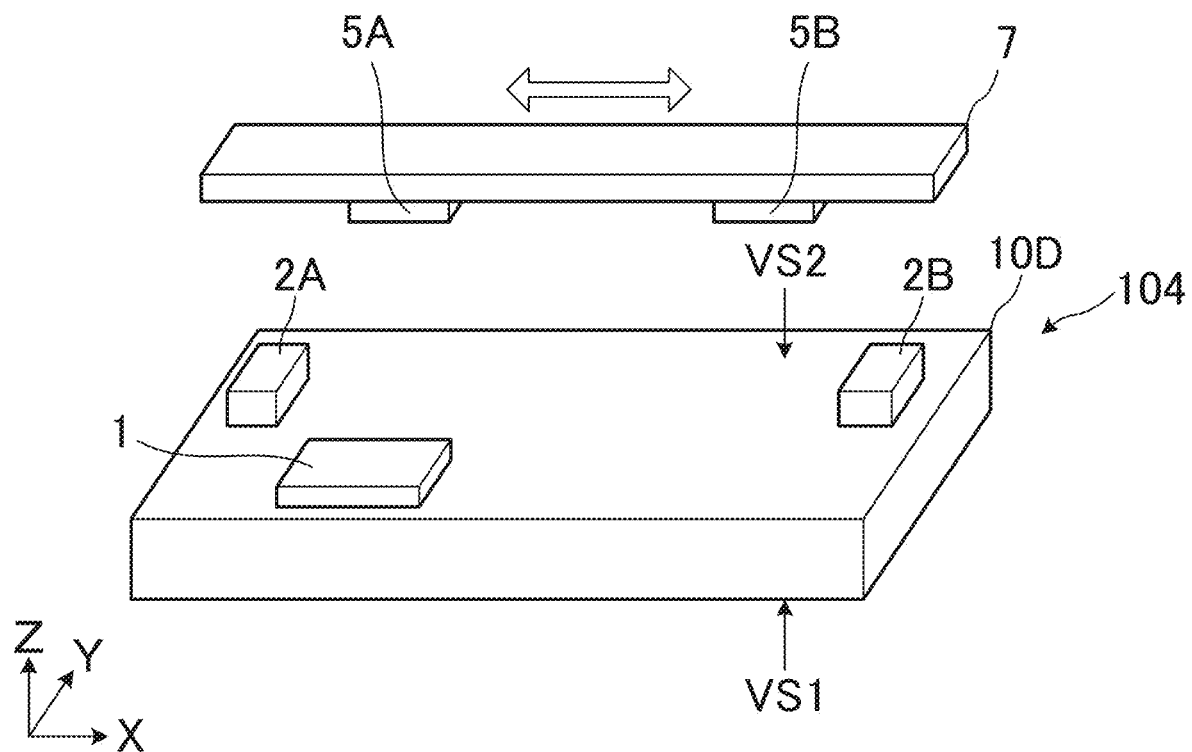
FIG. 15 is a cross-sectional view of a state in which the multilayer substrate 104 is used.

The multilayer substrate 104 is used, for example, as follows. FIG. 15 is a cross-sectional view of a state in which the multilayer substrate 104 is used.

FIG. 15 shows magnets 5A and 5B that are attached to a movable body 7. When a predetermined current flows into a coil (see the coil 3 shown in FIG. 13B), the magnets 5A and 5B are displaced (see the white arrow in FIG. 15), due to a magnetic field emitted from the coil, in a direction (the Y-axis direction) perpendicular or substantially perpendicular to the stacking direction (the Z-axis direction). The magnetic sensors 2A and 2B sense a change in the magnetic field when the magnets 5A and 5B are displaced.

According to the multilayer substrate 104 of the fourth preferred embodiment of the present invention, the following advantageous effects in addition to the advantageous effects described in the first preferred embodiment are obtained.

(a) In the multilayer substrate 104, the insulating base material layer includes a parallel portion CML, and the connection conductor 61 (the first connection conductor) and the connection conductor 63 (the second connection conductor) are parallel or substantially parallel to each other in the parallel portion CML so that the directions of currents are opposite to each other. With this configuration, in the parallel portion CML, magnetic fluxes generated from the connection conductor (the connection conductors 61 and 63), the magnetic fluxes not having substantially contributed to formation of the magnetic field of the coil 3 that interacts with a magnet, are counteracted. Accordingly, unnecessary radiation from portions (the first connection conductor and the second connection conductor) other than the coil is able to be reduced.

It is to be noted that, in the fourth preferred embodiment, the connection conductor 63 is parallel or substantially parallel to the coil conductor 31A on a side of the negative Y direction of the coil conductor 31A, so that, in a portion AC in which the connection conductor 63 and the coil conductor 31A are adjacent to each other, a current flows into the connection conductor 63 and the coil conductor 31A in the same direction. Therefore, in a portion adjacent to the coil conductor 31A, a decrease in inductance of the coil 3 (the first coil portion LP1) is able to be significantly reduced or prevented. In a case in which the connection conductor 63 is adjacent to the coil conductor 31A on sides of the positive Y direction and the negative X direction of the coil conductor 31A, a current flows in opposite directions in an adjacent portion in which the connection conductor 63 and the coil conductor 31A are adjacent to each other, so that inductance of the coil is decreased in the adjacent portion.

Figure 16:
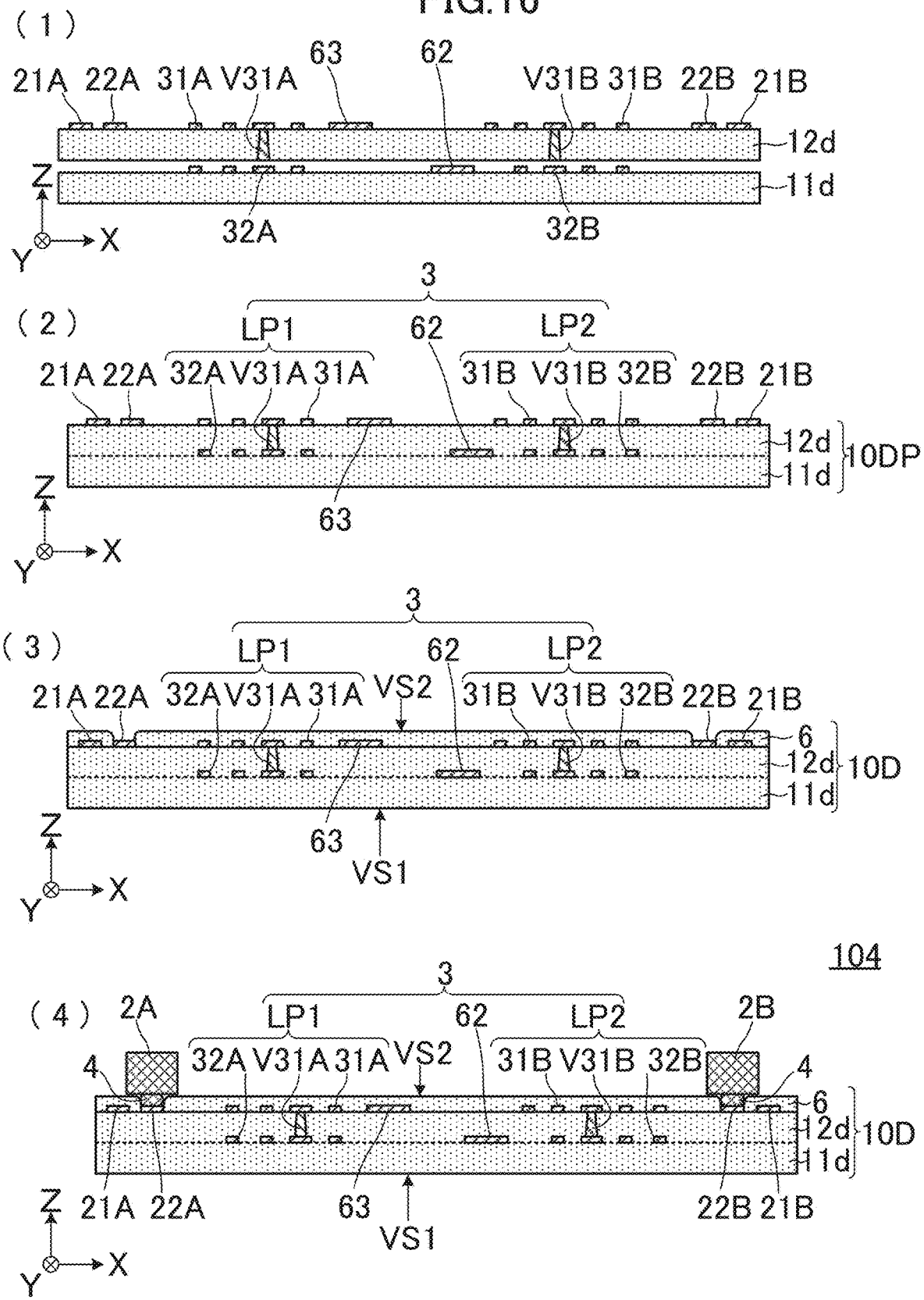
FIG. 16 is a cross-sectional view sequentially showing a process of manufacturing the multilayer substrate 104.

The multilayer substrate 104 according to the fourth preferred embodiment is preferably manufactured by, for example, the following process. FIG. 16 is a cross-sectional view sequentially showing a process of manufacturing the multilayer substrate 104. It is to be noted that, in FIG. 16, for the sake of convenience of explanation, although explanation will be provided in a manufacturing process for one chip (an individual piece), the actual process of manufacturing the multilayer substrate is performed in a collective substrate state.

As shown in (1) in FIG. 16, first, the plurality of insulating base material layers 11d and 12d are prepared. The configurations of the insulating base material layers 11d and 12d are the same or substantially the same as the configurations described in the first preferred embodiment.

Subsequently, coil conductors 31A, 31B, 32A, and 32B, connection conductors 62, 63, and the like, conductors 21A, 21B, 22A, 22B, and the like, and external electrodes are provided on the insulating base material layers 11d and 12d.

Specifically, metal foil (copper foil, for example) is laminated on first and second principal surfaces of the insulating base material layer 11d in the collective substrate state and then patterned by photolithography, for example, to form the external electrodes, the coil conductors 32A and 32B, and the connection conductor 62. In addition, metal foil (copper foil, for example) is laminated on a first principal surface of the insulating base material layer 12d in the collective substrate state and then patterned by photolithography, for example, to form the coil conductors 31A and 31B, the connection conductors 63 and the like, and the conductors 21A, 21B, 22A, 22B, and the like.

It is to be noted that interlayer connection conductors V31A, V31B, and the like are provided on the plurality of insulating base material layers 11d and 12d. The interlayer connection conductors are provided by forming a through hole on the plurality of insulating base material layers 11d and 12d with a laser or other suitable method, for example, then providing (filling) a conductive paste preferably including one or more of Cu, Ag, Sn, Ni, and Mo or an alloy preferably including one or more of Cu, Ag, Sn, Ni, and Mo, for example, and curing (solidifying) the conductive paste through the subsequent heating and pressing. Therefore, the interlayer connection conductors are preferably made of a material having a melting point (a melting temperature) lower than the temperature at the time of the subsequent heating and pressing.

Next, as shown in (1) and (2) in FIG. 16, the plurality of insulating base material layers 11d and 12d are stacked in order, and the stacked insulating base material layers 11d and 12d are heated and pressed (collectively pressed) to form a stacked body 10DP in the collective substrate state.

Subsequently, as shown in (3) in FIG. 16, a protective layer 6 is provided on a side of a first principal surface (an upper surface of the stacked body 10D shown in (3) in FIG. 16) of the stacked body 10DP. The protective layer 6 is preferably, for example, a solder resist film, a coverlay film, or the like.

The protective layer 6 includes opening portions at positions corresponding to portions of the conductors (the connection electrodes CP1 and CP2, the electrode portions 71A, 71B, 72A, 72B, 81A, 81B, 82A, and 82B, and the conductors 41, 42, 43, and 44 that are shown in FIG. 14) provided on a surface of the insulating base material layer 12d. Therefore, the protective layer 6 is provided on the upper surface of the insulating base material layer 12d, so that the portions of the conductors are exposed from the second principal surface VS2 of the stacked body 10D.

Next, as shown in (4) in FIG. 16, a driver IC (not shown) and the magnetic sensors 2A and 2B are mounted to the second principal surface VS2 of the stacked body 10D. Specifically, a plurality of mounting electrodes of the driver IC, through a conductive bonding material, are connected to the conductors (the connection electrodes CP1 and CP2, the electrode portions 71A, 71B, 81A, and 81B, and the conductors 41, 42, 43, and 44 that are shown in FIG. 14) exposed from the second principal surface VS2. In addition, the magnetic sensors 2A and 2B are connected to the conductors (the electrode portions 72A, 72B, 82A, and 82B that are shown in FIG. 14) exposed from the second principal surface VS2 through the conductive bonding material 4. The conductive bonding material 4 preferably includes solder, for example.

Lastly, the collective substrate is divided to separate individual pieces from each other to obtain a multilayer substrate 104.

Fifth Preferred Embodiment

A fifth preferred embodiment of the present invention provides an example of a multilayer substrate having a feature of an arrangement of a plurality of magnetic sensors.

Figure 17A:
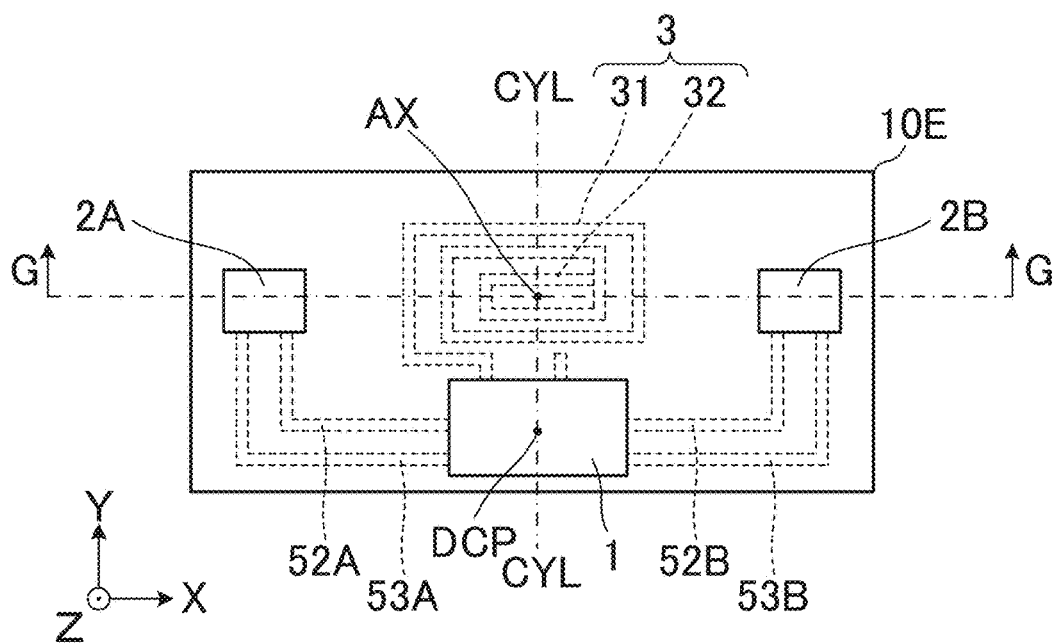
FIG. 17A is a plan view of a multilayer substrate 105 according to a fifth preferred embodiment of the present invention.
Figure 17B:
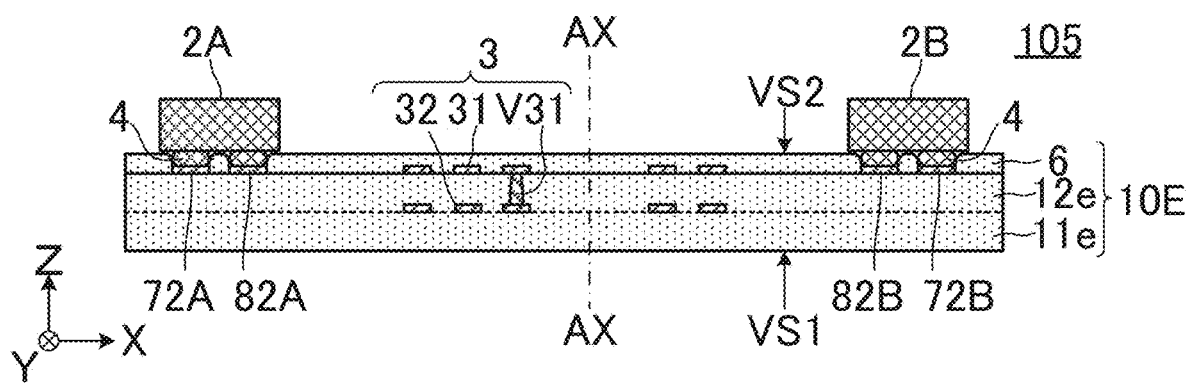
FIG. 17B is a G-G cross-sectional view in FIG. 17A.
Figure 18:
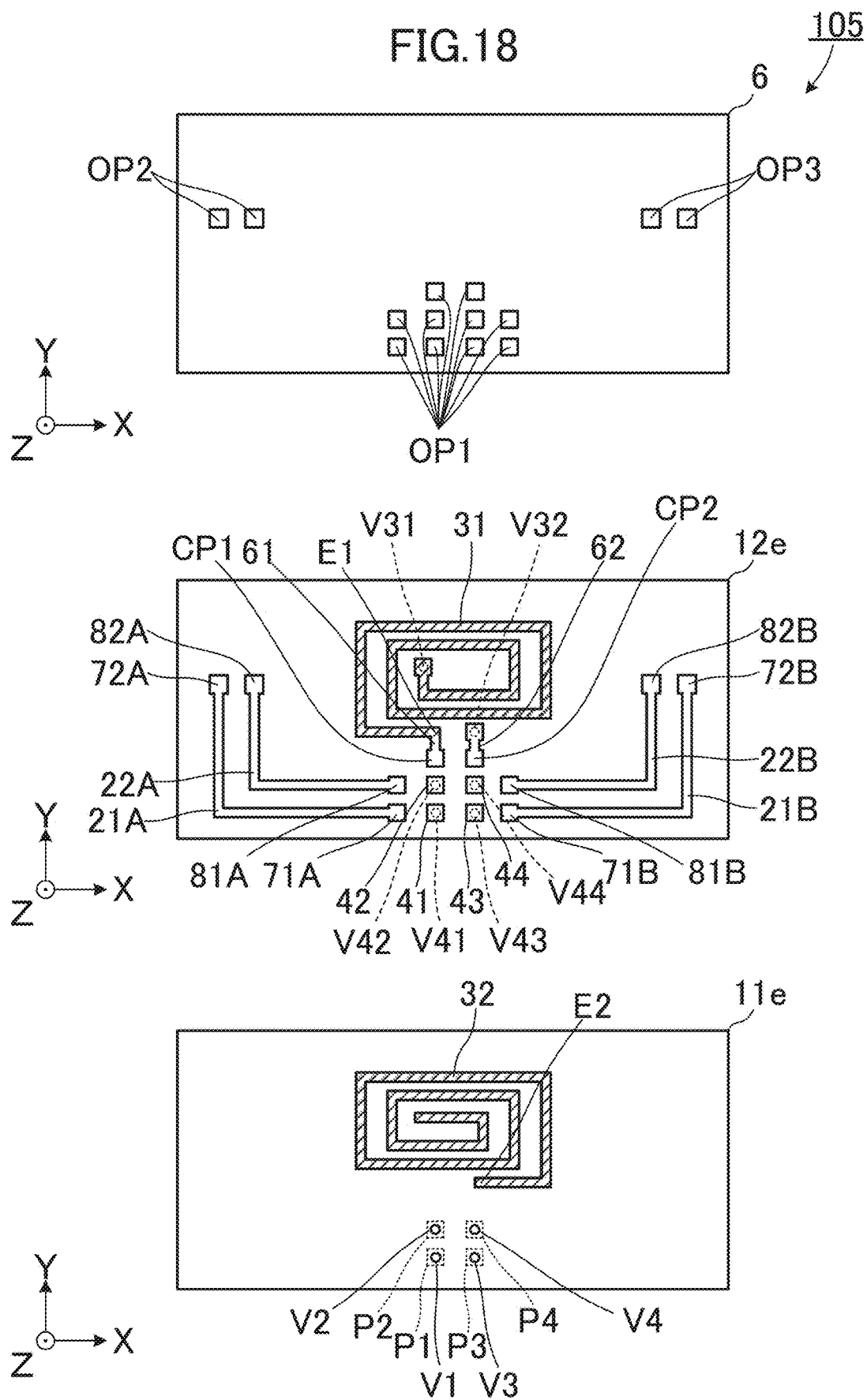
FIG. 18 is plan view of each of a protective layer 6 and base material layers 11e and 12e of the multilayer substrate 105.

FIG. 17A is a plan view of a multilayer substrate 105 according to a fifth preferred embodiment of the present invention, and FIG. 17B is a G-G cross-sectional view in FIG. 17A. FIG. 18 is a plan view of each of a protective layer 6 and base material layers 11e and 12e of the multilayer substrate 105. In addition, in FIG. 18, in order to make the structure more understandable, coil conductors 31 and 32 are indicated by hatching.

The multilayer substrate 105 includes a stacked body 10E, a driver IC 1, magnetic sensors 2A and 2B, and a coil 3 (to be described in detail later) provided in the stacked body 10E.

The multilayer substrate 105 is different from the multilayer substrate 101 according to the first preferred embodiment of the present invention in that one coil is provided. In addition, the multilayer substrate 105 is different from the multilayer substrate 101 in that the driver IC 1 and the magnetic sensors 2A and 2B are mounted to a second principal surface VS2 of the stacked body 10E. Other configurations are the same or substantially the same as the configurations of the multilayer substrate 101.

Hereinafter, differences from the multilayer substrate 101 according to the first preferred embodiment will be described.

In the magnetic sensors 2A and 2B according to the fifth preferred embodiment, the polarities of the voltage generated due to the magnetic field from the driver IC 1 are opposite to each other. It is to be noted that, in the fifth preferred embodiment, the magnetic sensor 2A corresponds to the "first magnetic sensor", and the magnetic sensor 2B corresponds to the "second magnetic sensor".

The stacked body 10E is obtained by sequentially stacking a plurality of insulating base material layers 11e and 12e that are preferably made of a resin material (a thermoplastic resin), for example, and a protective layer 6. The configurations of the plurality of insulating base material layers 11e and 12e are the same or substantially the same as the configurations of the plurality of insulating base material layers 11a and 12a described in the first preferred embodiment. The protective layer 6 is preferably, for example, a solder resist film, a coverlay film, or the like.

A coil conductor 32 is provided on a surface of the insulating base material layer 11e. The coil conductor 32 is preferably a substantially 2.5-turn rectangular or substantially rectangular spiral conductor disposed near the center of the insulating base material layer 11e.

External electrodes P1, P2, P3, and P4 are provided on the back surface of the insulating base material layer 11e. The external electrodes P1, P2, P3, and P4 are preferably, for example, rectangular or substantially rectangular conductors disposed near the center of a third side (a lower side of the insulating base material layer 11e in FIG. 18) of the insulating base material layer 11e.

In addition, interlayer connection conductors V1, V2, V3, and V4 are provided on the insulating base material layer 11e.

A coil conductor 31, connection conductors 61 and 62, and conductors 21A, 21B, 22A, 22B, 41, 42, 43, and 44 are provided on a surface of the insulating base material layer 12e. The coil conductor 31 is preferably a substantially 2-turn rectangular or substantially rectangular spiral conductor disposed near the center of the insulating base material layer 12e. The connection conductors 61 and 62 are linear conductors disposed near the center of the insulating base material layer 12e and extending in the Y-axis direction. The conductors 21A and 22A are preferably, for example, L-shaped conductors disposed near a first corner (a lower left corner of the insulating base material layer 12e in FIG. 18) of the insulating base material layer 12e. The conductors 21B and 22B are preferably, for example, L-shaped conductors disposed near a second corner (a lower right corner of the insulating base material layer 12e in FIG. 18) of the insulating base material layer 12e. The conductors 41, 42, 43, and 44 are preferably, for example, rectangular or substantially rectangular conductors disposed near a third side (a lower side of the insulating base material layer 12e in FIG. 18) of the insulating base material layer 12e.

In addition, interlayer connection conductors V31, V32, V41, V42, V43, and V44 are provided in the insulating base material layer 12e.

The protective layer 6 is preferably, for example, a resin film disposed on the entirety or substantially the entirety of a surface (a surface on the side of the second principal surface VS2 of the stacked body 10E) of the insulating base material layer 12e and covering the conductors provided on the surface of the insulating base material layer 12e.

The protective layer 6 includes a plurality of opening portions OP1 at positions corresponding to a first end (a connection electrode CP1) of the connection conductor 61, a first end (a connection electrode CP2) of the connection conductor 62, a first end (an electrode portion 71A) of the conductor 21A, a first end (an electrode portion 81A) of the conductor 22A, a first end (an electrode portion 71B) of the conductor 21B, a first end (an electrode portion 81B) of the conductor 22B, and the conductors 41, 42, 43, and 44. Therefore, the protective layer 6 is provided on the upper surface of the insulating base material layer 12e, so that the connection electrodes CP1 and CP2, the electrode portions 71A, 71B, 81A, and 81B, and the conductors 41, 42, 43, and 44 are exposed from the second principal surface VS2 of the stacked body 10E.

In addition, the protective layer 6 includes a plurality of opening portions OP2 at positions corresponding to a second end (an electrode portion 72A) of the conductor 21A, and a second end (an electrode portion 82A) of the conductor 22A. Therefore, the protective layer 6 is provided on the upper surface of the insulating base material layer 12e, so that the electrode portions 72A and 82A are exposed from the second principal surface VS2 of the stacked body 10E.

Further, the protective layer 6 includes a plurality of opening portions OP3 at positions corresponding to a second end (an electrode portion 72B) of the conductor 21B, and a second end (an electrode portion 82B) of the conductor 22B. Therefore, the protective layer 6 is provided on the upper surface of the insulating base material layer 12e, so that the electrode portions 72B and 82B are exposed from the second principal surface VS2 of the stacked body 10E.

In the fifth preferred embodiment, as mainly shown in FIG. 17B, the driver IC 1 is mounted to the second principal surface VS2 of the stacked body 10E. A plurality of mounting electrodes of the driver IC 1 are connected to the conductors (the connection electrodes CP1 and CP2, the electrode portions 71A, 71B, 81A, and 81B, and the conductors 41, 42, 43, and 44 that are shown in FIG. 18) exposed from the second principal surface VS2 through a conductive bonding material 4, respectively.

In addition, in the fifth preferred embodiment, as mainly shown in FIG. 17B, the magnetic sensors 2A and 2B are mounted to the second principal surface VS2 of the stacked body 10E. The magnetic sensors 2A and 2B include terminals to be respectively connected to the conductors (the electrode portions 72A, 72B, 82A, and 82B that are shown in FIG. 18) exposed from the second principal surface VS2 through the conductive bonding material 4.

As mainly shown in FIG. 18, a first end of the coil conductor 31 is connected to a first end of the coil conductor 32 through the interlayer connection conductor V31. In such a manner, the coil conductors 31 and 32 respectively provided on the plurality of insulating base material layers 11e and 12e, and the interlayer connection conductor V31 define a coil 3 including about 4.5 turns. As shown in FIG. 17A, the coil 3 includes a winding axis AX in the Z-axis direction.

A first end E1 (a second end of the coil conductor 31) of the coil 3 is connected to a second end of the connection conductor 61. A first end (a connection electrode CP1) of the connection conductor 61 is connected to a mounting electrode of the driver IC 1 through the conductive bonding material 4. In addition, a second end E2 (a second end of the coil conductor 32) of the coil 3 is connected to a second end of the connection conductor 62 through the interlayer connection conductor V32. A first end (a connection electrode CP2) of the connection conductor 62 is connected to a mounting electrode of the driver IC 1 through the conductive bonding material 4.

In addition, the external electrodes P1, P2, P3, and P4 are connected to a plurality of the mounting electrodes of the driver IC 1, respectively. Specifically, the external electrode P1 is connected to the conductor 41 through the interlayer connection conductors V1 and V41, and this conductor 41 is connected to a mounting electrode of the driver IC 1 through the conductive bonding material 4. In addition, the external electrode P2 is connected to the conductor 42 through the interlayer connection conductors V2 and V42, and this conductor 42 is connected to a mounting electrode of the driver IC 1 through the conductive bonding material 4. The external electrode P3 is connected to the conductor 43 through the interlayer connection conductors V3 and V43, and this conductor 43 is connected to a mounting electrode of the driver IC 1 through the conductive bonding material 4. In addition, the external electrode P4 is connected to the conductor 44 through the interlayer connection conductors V4 and V44, and this conductor 44 is connected to a mounting electrode of the driver IC 1 through the conductive bonding material 4.

The magnetic sensor 2A includes terminals to be connected to the driver IC 1. Specifically, the terminals of the magnetic sensor 2A are connected to the second ends (the electrode portions 72A and 82A) of the conductors 21A and 22A through the conductive bonding material 4, respectively. The first ends (the electrode portions 71A and 81A) of the conductors 21A and 22A are connected to the mounting electrodes of the driver IC 1 through the conductive bonding material 4, respectively.

In addition, the magnetic sensor 2B includes terminals to be connected to the driver IC 1. Specifically, the terminals of the magnetic sensor 2B are connected to the second ends (the electrode portions 72B and 82B) of the conductors 21B and 22B through the conductive bonding material 4, respectively. The first ends (the electrode portions 71B and 81B) of the conductors 21B and 22B are connected to the mounting electrodes of the driver IC 1 through the conductive bonding material 4, respectively.

As shown in FIG. 17A, the magnetic sensors 2A and 2B (the first magnetic sensor and the second magnetic sensor) are disposed at positions symmetric or substantially symmetric with respect to the center DCP of the driver IC 1. Specifically, the magnetic sensors 2A and 2B are disposed rotationally symmetric or substantially rotationally symmetric to each other by about 180 degrees around the Y axis CYL passing through the center DCP of the driver IC 1.

In addition, as shown in FIG. 17A and FIG. 18, wiring (the conductors 21A and 22A) between the driver IC 1 and the magnetic sensor 2A (the first magnetic sensor) and wiring (the conductors 21B and 22B) between the driver IC 1 and the magnetic sensor 2B (the second magnetic sensor) are symmetric or substantially symmetric with respect to the center DCP of the driver IC 1. Specifically, the wiring (the conductors 21A and 22A) between the driver IC 1 and the magnetic sensor 2A and the wiring (the conductors 21B and 22B) between the driver IC 1 and the magnetic sensor 2B are disposed rotationally symmetric or substantially rotationally symmetric to each other by about 180 degrees around the Y axis CYL passing through the center DCP of the driver IC 1.

Further, the magnetic sensors 2A and 2B (the first magnetic sensor and the second magnetic sensor) are disposed at positions symmetric or substantially symmetric with respect to a winding axis AX of the coil 3. Specifically, the magnetic sensors 2A and 2B are disposed rotationally symmetric or substantially rotationally symmetric to each other by 180 degrees around the winding axis AX of the coil 3.

Figure 19:
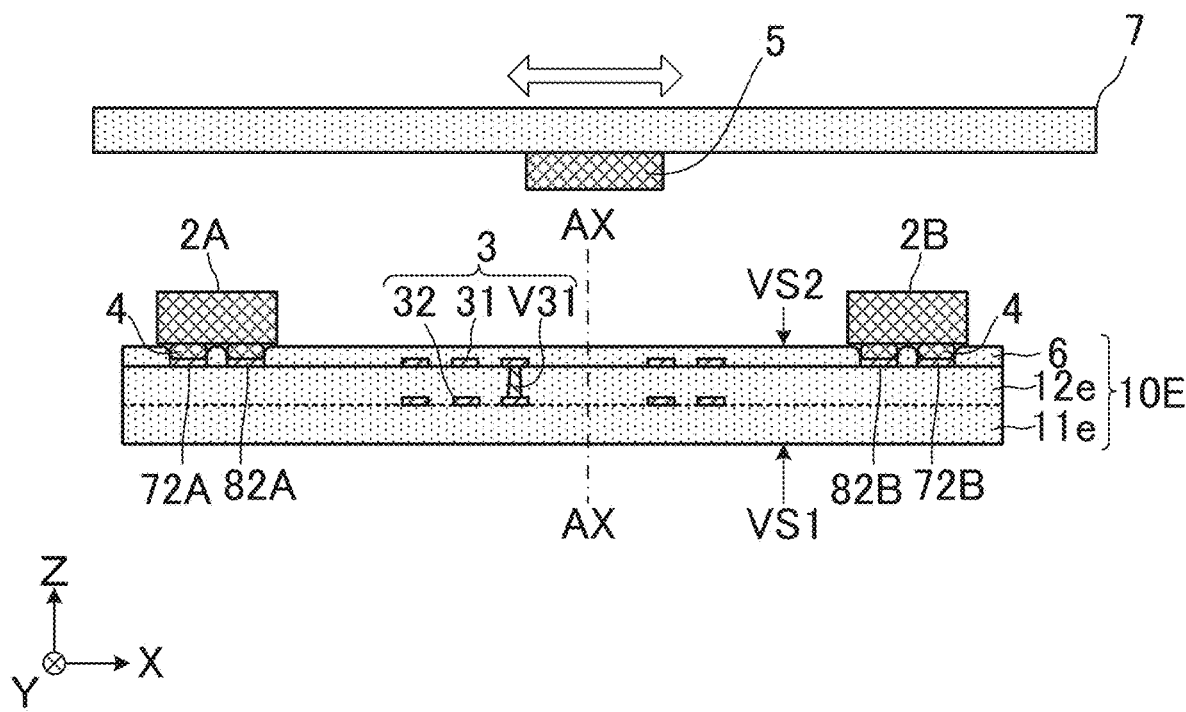
FIG. 19 is a cross-sectional view of a state in which the multilayer substrate 105 is used.

The multilayer substrate 105 is used, for example, as follows. FIG. 19 is a cross-sectional view of a state in which the multilayer substrate 105 is used.

FIG. 19 shows a magnet 5 that is attached to a movable body 7. When a predetermined current flows into a coil (see the coil 3 shown in FIG. 17B), the magnet 5 is displaced (see the white arrow in FIG. 19), due to a magnetic field emitted from the coil, in a direction (the Y-axis direction) perpendicular or substantially perpendicular to the stacking direction (the Z-axis direction). The magnetic sensors 2A and 2B sense a change in the magnetic field when the magnet 5 is displaced.

According to the multilayer substrate 105 of the fifth preferred embodiment of the present invention, the following advantageous effects in addition to the advantageous effects described in the first preferred embodiment are obtained.

(a) In the multilayer substrate 105, the magnetic sensors 2A and 2B include mutually opposite polarities of the voltage generated due to the magnetic field from the driver IC 1. In addition, in the multilayer substrate 105, the magnetic sensors 2A and 2B (the first magnetic sensor and the second magnetic sensor) are disposed at positions symmetric or substantially symmetric with respect to the center DCP of the driver IC 1. With this configuration, even when noise is superimposed on the magnetic field mainly generated from the driver IC 1, the effects of the magnetic field mainly generated from the driver IC 1 on the magnetic sensors 2A and 2B are able to be equal or substantially equal (equivalent). Therefore, the addition of signals from the magnetic sensors 2A and 2B cancels a noise component, and is able to improve the accuracy of detecting a position of the magnet by the magnetic sensors 2A and 2B.

It is to be noted that, while the fifth preferred embodiment of the present invention provides an example in which the magnetic sensors 2A and 2B include mutually opposite polarities of the voltage generated due to the magnetic field from the driver IC 1, the present invention is not limited to this example. The polarities of the voltage generated in the "first magnetic sensor" and the "second magnetic sensor" due to the magnetic field from the driver IC do not necessarily need to be opposite to each other.

(b) In addition, in the multilayer substrate 105, the wiring (the conductors 21A and 22A) between the driver IC 1 and the magnetic sensor 2A (the first magnetic sensor) and the wiring (the conductors 21B and 22B) between the driver IC 1 and the magnetic sensor 2B (the second magnetic sensor) are symmetric or substantially symmetric with respect to the center DCP of the driver IC 1. With this configuration, even when noise is superimposed on the magnetic field mainly generated from the driver IC 1, the effects of the magnetic field mainly generated from the driver IC 1 on the wiring between the driver IC 1 and the magnetic sensors 2A and 2B are able to be equal or substantially equal (equivalent). Therefore, the addition of signals from the magnetic sensors 2A and 2B cancels a noise component, and, as a result, is able to improve the accuracy of detecting a position of the magnet by the magnetic sensors 2A and 2B.

(c) Further, in the multilayer substrate 105, the magnetic sensors 2A and 2B (the first magnetic sensor and the second magnetic sensor) are disposed at positions symmetric or substantially symmetric with respect to the winding axis AX of the coil 3. With this configuration, even when noise is superimposed on the magnetic field emitted from the coil 3, the effects of the magnetic field generated from the coil 3 on the magnetic sensors 2A and 2B are able to be substantially equal (equivalent). Therefore, the addition of signals from the magnetic sensors 2A and 2B cancels a noise component, and is able to improve the accuracy of detecting a position of the magnet by the magnetic sensors 2A and 2B.

The multilayer substrate 105 according to the fifth preferred embodiment is preferably manufactured by, for example, the following process. FIG. 20 is a cross-sectional view sequentially showing a process of manufacturing the multilayer substrate 105. It is to be noted that, in FIG. 20, for the sake of convenience of explanation, although explanation will be provided in a manufacturing process for one chip (an individual piece), the actual process of manufacturing the multilayer substrate is performed in a collective substrate state.

As shown in (1) in FIG. 20, first, the plurality of insulating base material layers 11e and 12e are prepared. The configurations of the insulating base material layers 11e and 12e are the same or substantially the same as the configurations described in the first preferred embodiment.

Subsequently, coil conductors 31 and 32, conductors 21A, 21B, 22A, 22B, 41, 42, 43, and 44, and external electrodes P1, P2, P3, and P4 are provided on the insulating base material layers 11e and 12e (see FIG. 18).

Specifically, metal foil (copper foil, for example) is laminated on first and second principal surfaces of the insulating base material layer 11e in the collective substrate state and then patterned by photolithography, for example, to form the coil conductor 32 and the external electrodes P1, P2, P3, and P4. In addition, metal foil (copper foil, for example) is laminated on a first principal surface of the insulating base material layer 12e in the collective substrate state and then patterned by photolithography, for example, to form the coil conductor 31 and the conductors 21A, 21B, 22A, 22B, 41, 42, 43, and 44.

It is to be noted that the interlayer connection conductors V1, V2, V3, V4, V31, V32, V41, V42, V43, and V44 are provided on the plurality of insulating base material layers 11e and 12e. The interlayer connection conductors are provided by forming a through hole on the plurality of insulating base material layers 11e and 12e with a laser or other suitable method, for example, then providing (filling) a conductive paste preferably including one or more of Cu, Ag, Sn, Ni, and Mo or an alloy preferably including one or more of Cu, Ag, Sn, Ni, and Mo, for example, and curing (solidifying) the conductive paste through the subsequent heating and pressing. Therefore, the interlayer connection conductors are preferably made of a material having a melting point (a melting temperature) lower than the temperature at the time of the subsequent heating and pressing.

Next, as shown in (1) and (2) in FIG. 20, the plurality of insulating base material layers 11e and 12e are stacked in order, and the stacked insulating base material layers 11e and 12e are heated and pressed (collectively pressed) to form a stacked body 10EP in the collective substrate state.

Subsequently, as shown in (3) in FIG. 20, a protective layer 6 is provided on a side of a first principal surface (an upper surface of the stacked body 10E shown in (3) in FIG. 20) of the stacked body 10EP. The protective layer 6 is preferably, for example, a solder resist film, a coverlay film, or the like.

The protective layer 6 includes a plurality of opening portions at positions corresponding to portions of the conductors (a first end (a connection electrode CP1) of the connection conductor 61, a first end (a connection electrode CP2) of the connection conductor 62, first and second ends (electrode portions 71A and 72A) of the conductor 21A, first and second ends (electrode portions 81A and 82A) of the conductor 22A, first and second ends (electrode portions 71B and 72B) of the conductor 21B, first and second ends (electrode portions 81B and 82B) of the conductor 22B, and the conductors 41, 42, 43, and 44 that are shown in FIG. 18) provided on a surface of the insulating base material layer 12e. Therefore, the protective layer 6 is provided on the upper surface of the insulating base material layer 12e, so that the portions of the conductors are exposed from the second principal surface VS2 of the stacked body 10E.

Next, as shown in (4) in FIG. 20, a driver IC (not shown) and the magnetic sensors 2A and 2B are mounted to the second principal surface VS2 of the stacked body 10E. Specifically, a plurality of mounting electrodes of the driver IC, through a conductive bonding material, are connected to the portions of the conductors (the connection electrodes CP1 and CP2, the electrode portions 71A, 71B, 81A, and 81B, and the conductors 41, 42, 43, and 44 that are shown in FIG. 18) exposed from the second principal surface VS2. In addition, the magnetic sensors 2A and 2B, through the conductive bonding material 4, are connected to the conductors (the electrode portions 72A, 72B, 82A, and 82B that are shown in FIG. 18) exposed from the second principal surface VS2. The conductive bonding material 4 includes solder, for example.

Lastly, the collective substrate is divided to separate individual pieces from each other to obtain a multilayer substrate 105.

In addition, while the fifth preferred embodiment of the present invention provides an example in which the magnetic sensors 2A and 2B (the first magnetic sensor and the second magnetic sensor) are disposed rotationally symmetric or substantially rotationally symmetric to each other by about 180 degrees around the Y axis CYL passing through the center DCP of the driver IC 1, the present invention is not limited to this configuration. In the present invention, a description of "the first magnetic sensor and the second magnetic sensor are symmetric or substantially symmetric with respect to the center of the driver IC" includes an example in which the magnetic sensors 2A and 2B are disposed rotationally symmetric or substantially rotationally symmetric to each other by degrees (about 120 degrees, for example) other than about 180 degrees around the Y axis CYL passing through the center DCP of the driver IC 1, for example. Furthermore, an example in which the magnetic sensors 2A and 2B are disposed point symmetric or substantially point symmetric with respect to the center DCP of the driver IC 1 is also included.

While the fifth preferred embodiment of the present invention provides an example in which the wiring (the conductors 21A and 22A) between the driver IC 1 and the magnetic sensor 2A (the first magnetic sensor) and the wiring (the conductors 21B and 22B) between the driver IC 1 and the magnetic sensor 2B (the second magnetic sensor) are rotationally symmetric or substantially rotationally symmetric to each other by about 180 degrees around the Y axis CYL passing through the center DCP of the driver IC 1, the present invention is not limited to this configuration. In the present invention, a description of "the wiring between the driver IC and the first magnetic sensor and the wiring between the driver IC and the second magnetic sensor are symmetric or substantially symmetric with respect to the center of the driver IC" includes an example in which the wiring between the driver IC 1 and the first magnetic sensor and the wiring between the driver IC 1 and the second magnetic sensor are disposed rotationally symmetric or substantially rotationally symmetric to each other by degrees (about 120 degrees, for example) other than about 180 degrees around the Y axis CYL passing through the center DCP of the driver IC 1, for example. Furthermore, an example in which the wiring between the driver IC 1 and the first magnetic sensor and the wiring between the driver IC 1 and the second magnetic sensor are disposed point symmetric or substantially point symmetric with respect to the center DCP of the driver IC 1 is included.

While each of the above described preferred embodiments of the present invention provides an example in which the stacked body has a substantially cuboid shape, the present invention is not limited to such a configuration. The shape of the stacked body is able to be appropriately changed within the scope of producing the advantageous operational effects of the present invention, and may be, for example, a cube, a polygonal column, a circular cylinder, an elliptic cylinder, or a similar shape, and the plane shape of the stacked body may be an L shape, a crank shape, a T shape, or a Y shape, for example.

In addition, while each of the above described preferred embodiments of the present invention provides an example of the multilayer substrate including the stacked body obtained by stacking two to four insulating base material layers, the present invention is not limited to such a configuration. The number of insulating base material layers defining the stacked body is able to be appropriately changed within the scope of producing the advantageous operational effects of the present invention. It is to be noted that the protective layer 6 described in the fourth and fifth preferred embodiments is dispensable in the present invention.

While each of the above described preferred embodiments of the present invention provides an example in which the stacked body is obtained by stacking a plurality of insulating base material layers that are made of a thermoplastic resin, the present invention is not limited to such a configuration. The stacked body may be configured by stacking a plurality of insulating base material layers that are made of a thermosetting resin, for example.

In addition, the shape of the coil, the number of coils, and the number of windings of the coil in the present invention are not limited to the configurations of each of the above described preferred embodiments of the present invention, and are able to be appropriately changed within the scope of producing the advantageous operational effects of the present invention. The coil may be planar loop-shaped, planar spiral-shaped, and helical shaped, for example. In addition, the number of coils may not be limited to one or two, but may be three or more. The coil may include a coil conductor provided on one insulating base material layer or may include a plurality of coil conductors provided on three or more insulating base material layers.

While each of the above described preferred embodiments of the present invention provides an example in which the four external electrodes P1, P2, P3, and P4 each of which have a rectangular or substantially rectangular plane shape are provided on the first principal surface VS1 of the stacked body, the present invention is not limited to such a configuration. The shape of the external electrode, the number of external electrodes, and the positions of the external electrodes are able to be appropriately changed within the scope of producing the advantageous operational effects of the present invention. The number of external electrodes is able to be appropriately changed by a circuit configuration of the multilayer substrate. It is to be noted that, while each of the above described preferred embodiments of the present invention provides an example of the multilayer substrate including a driver IC, a coil, and a magnetic sensor, electronic components (a chip inductor or a chip capacitor, for example) or similar components other than such components may be mounted to the multilayer substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
   a stacked body including a plurality of insulating base material layers that are stacked;
   a driver IC mounted to the stacked body and including a plurality of mounting electrodes;
   a coil including a first end and a second end, where the first end is electrically connected to one of the plurality of mounting electrodes through a conductive bonding material, and the second end is electrically connected to another one of the plurality of mounting electrodes through another conductive bonding material; and
   a magnetic sensor mounted to the stacked body and connected to the driver IC; wherein
   at least a portion of the coil is provided inside the stacked body; and
   within a connection path from the first end of the coil to the one of the plurality of mounting electrodes, the conductive bonding material is disposed at only one position.

2. The multilayer substrate according to claim 1, wherein each of the conductive bonding material and the another conductive bonding material is provided in a hole that penetrates through any one of the plurality of insulating base material layers.

3. The multilayer substrate according to claim 1, wherein within a connection path from the second end of the coil to the another one of the plurality of mounting electrodes, the another conductive bonding material is disposed at only one position.

4. The multilayer substrate according to claim 1, wherein the magnetic sensor includes a first magnetic sensor and a second magnetic sensor; and
   the first magnetic sensor and the second magnetic sensor are disposed at positions symmetric or substantially symmetric with respect to a center of the driver IC.

5. The multilayer substrate according to claim 4, wherein wiring between the driver IC and the first magnetic sensor and wiring between the driver IC and the second magnetic sensor are symmetric or substantially symmetric with respect to the center of the driver IC.

6. The multilayer substrate according to claim 4, wherein the coil is a single coil; and
   the first magnetic sensor and the second magnetic sensor are disposed at positions symmetric or substantially symmetric with respect to a winding axis of the coil.

7. The multilayer substrate according to claim 1, further comprising:
   a first connection electrode provided on one of the plurality of insulating base material layers and connected to the one of the plurality of mounting electrodes through the conductive bonding material;
   a second connection electrode provided on the one the insulating base material layers and connected to the another one of the plurality of mounting electrodes through the another conductive bonding material;
   a first connection conductor provided on the one of the plurality of insulating base material layers and connecting the first end of the coil and the first connection electrode; and
   a second connection conductor provided on the one of the plurality of insulating base material layers and connecting the second end of the coil and the second connection electrode; wherein the one of the plurality of insulating base material layers includes a parallel portion; and
   the first connection conductor and the second connection conductor are parallel or substantially parallel to each other in the parallel portion so that directions of currents are opposite to each other.

8. The multilayer substrate according to claim 1, wherein the magnetic sensor is a Hall element using a Hall effect.

9. The multilayer substrate according to claim 1, wherein the plurality of insulating base material layers are made of thermoplastic resin.

10. The multilayer substrate according to claim 1, wherein the plurality of insulating base material layers are made of a liquid crystal polymer.

11. The multilayer substrate according to claim 1, wherein the coil includes a plurality of coil conductors respectively provided on the plurality of the insulating base material layers.

12. The multilayer substrate according to claim 11, wherein the plurality of coil conductors are respectively connected to one another by interlayer connection conductors provided in the plurality of insulating base material layers.

13. The multilayer substrate according to claim 1, wherein the coil includes a first coil and a second coil; and
   each of the first and second coils includes a plurality of coil conductors respectively provided on the plurality of the insulating base material layers.

14. The multilayer substrate according to claim 11, wherein
   the plurality of coil conductors of the first coil are respectively connected to one another by first interlayer connection conductors provided in the plurality of insulating base material layers; and
   the plurality of coil conductors of the second coil are respectively connected to one another by second interlayer connection conductors provided in the plurality of insulating base material layers.

15. The multilayer substrate according to claim 13, wherein the driver IC is disposed between the first and second coils in a longitudinal direction of the stacked body.

16. The multilayer substrate according to claim 1, wherein the driver IC is embedded in the stacked body; and
   a mounting surface of the driver IC faces a surface of one of the plurality of insulating base material layers.

17. The multilayer substrate according to claim 1, wherein the magnetic sensor includes a first magnetic sensor and a second magnetic sensor; and
   each of the first and second magnetic sensors are embedded in the stacked body.

18. The multilayer substrate according to claim 1, wherein the coil includes about 3.5 turns.

19. The multilayer substrate according to claim 1, wherein the magnetic sensor is mounted on a principal surface of the stacked body.

20. The multilayer substrate according to claim 1, wherein the magnetic sensor includes a first magnetic sensor and a second magnetic sensor; and each of the first and second magnetic sensors is mounted on a principal surface of the stacked body.

\* \* \* \* \*